US012795988B2

(12) United States Patent
Altstätter

(10) Patent No.: US 12,795,988 B2
(45) Date of Patent: Nov. 10, 2026

(54) TRANSISTOR DEVICE

(71) Applicant: Infineon Technologies Austria AG, Villach (AT)

(72) Inventor: Christof Altstätter, Amlach (AT)

(73) Assignee: Infineon Technologies Austria AG, Villach (AT)

( * ) Notice: Subject to any disclaimer, the term of this patent is extended or adjusted under 35 U.S.C. 154(b) by 651 days.

(21) Appl. No.: 18/120,716

(22) Filed: Mar. 13, 2023

(65) Prior Publication Data

US 2023/0307538 A1 Sep. 28, 2023

(30) Foreign Application Priority Data

Mar. 24, 2022 (EP) ..................................... 22164139

(51) Int. Cl.
*H10D 30/66* (2025.01)
*H10D 62/10* (2025.01)
*H10D 64/00* (2025.01)
*H10D 64/23* (2025.01)

(52) U.S. Cl.
CPC ......... *H10D 30/668* (2025.01); *H10D 30/665* (2025.01); *H10D 62/127* (2025.01); *H10D 64/117* (2025.01); *H10D 64/256* (2025.01)

(58) Field of Classification Search
CPC .. H10D 30/668; H10D 30/665; H10D 62/127; H10D 64/117; H10D 64/256; H10D 30/66; H10D 64/519; H10D 62/104; H10D 62/107
See application file for complete search history.

(56) References Cited

U.S. PATENT DOCUMENTS

| | | | | |
|---|---|---|---|---|
| 9,252,263 | B1 * | 2/2016 | Vielemeyer | H10D 30/668 |
| 9,905,522 | B1 | 2/2018 | Lin | |
| 10,181,511 | B2 * | 1/2019 | Poelzl | H10D 30/0297 |
| 2013/0168764 | A1 * | 7/2013 | Hsieh | H10D 30/0297 438/270 |
| 2016/0013280 | A1 * | 1/2016 | Laforet | H10D 64/118 257/329 |
| 2016/0351668 | A1 | 12/2016 | Schwetlick et al. | |
| 2017/0005171 | A1 * | 1/2017 | Laforet | H10D 12/481 |
| 2017/0110573 | A1 * | 4/2017 | Laforet | H10D 12/038 |
| 2017/0250255 | A1 * | 8/2017 | Siemieniec | H10D 12/481 |
| 2017/0250256 | A1 * | 8/2017 | Siemieniec | H10D 12/481 |
| 2017/0317207 | A1 | 11/2017 | Hsieh | |
| 2019/0006513 | A1 * | 1/2019 | Ouvrard | H10D 12/038 |
| 2019/0165160 | A1 * | 5/2019 | Hutzler | H10D 12/00 |
| 2020/0335621 | A1 * | 10/2020 | Ma | H10D 30/0291 |

(Continued)

FOREIGN PATENT DOCUMENTS

EP 3739636 A1 11/2020

*Primary Examiner* — Cuong B Nguyen
*Assistant Examiner* — Khatib A Rahman
(74) *Attorney, Agent, or Firm* — Murphy, Bilak & Homiller, PLLC

(57) ABSTRACT

In an embodiment, a transistor device is provided that includes: a semiconductor substrate having a front surface and an active area, the active area including a plurality of active transistor cells, each active transistor cell having a columnar trench with a field plate, a mesa, and a gate electrode; and a metallization structure arranged on the front surface, the metallization structure providing a gate pad and a source pad. At least a part of the gate pad is arranged above the active area.

17 Claims, 11 Drawing Sheets

(56) References Cited

U.S. PATENT DOCUMENTS

| | | | | |
|---|---|---|---|---|
| 2020/0365724 | A1* | 11/2020 | Siemieniec .......... | H10D 62/126 |
| 2021/0249534 | A1* | 8/2021 | Neumann ............ | H10D 30/025 |
| 2021/0305369 | A1 | 9/2021 | Nakano et al. | |

* cited by examiner

TRANSISTOR DEVICE

BACKGROUND

Transistor devices used in power electronic applications are commonly fabricated with silicon (Si) semiconductor materials. Common transistor devices for power applications include Si CoolMOS®, Si Power MOSFETs, and Si Insulated Gate Bipolar Transistors (IGBTs).

A transistor device for power applications may be based on the charge compensation principle and may include an active cell field including a plurality of trenches, each including a field plate for charge compensation. In some designs, the trenches and the mesas that are formed between adjacent trenches each have an elongate striped structure. In some other designs, the trenches have a columnar needle-like shape, as for example disclosed in DE 10 2014 112371 A1. The field plate within the columnar trench also has a columnar or needle shape with the mesa being formed by the regions of the semiconductor substrate arranged between the columnar trenches. The columnar field plate provides charge compensation and offers an opportunity to reduce the area specific on resistance of the MOSFET device. Typically, the active cell field of the transistor device is laterally surrounded by an edge termination structure which serves to avoid breakdown of the semiconductor device due to edge effects and to improve the performance of the device. Transistor devices with improved performance would be desirable.

SUMMARY

According to the invention, a transistor device is provided which comprises a semiconductor substrate comprising a front surface and an active area. The active area comprises a plurality of active transistor cells, each active transistor cell comprising a columnar trench comprising a field plate. Each active transistor cell further comprises a mesa and a gate electrode. The transistor device further comprises a metallisation structure arranged on the front surface of the semiconductor substrate. The metallisation structure provides a gate pad and a source pad. At least a part of the gate pad is arranged above the active area.

Since at least part of the gate pad is arranged above the active area, this part of the gate pad is arranged above some of the active transistor cells of the active area. The term above is used to describe a plane that is substantially parallel to the front surface of the semiconductor substrate and separate from and spaced apart from the front surface of the semiconductor substrate. The active transistor cells of contribute to the switching of a load by the transistor device. Since at least part of the gate pad is arranged above the active area and active transistor cells, the active area is increased over designs in which the gate pad is arranged laterally adjacent the active area within the semiconductor substrate so that none of the active transistor cells are arranged underneath the gate pad. Since the active area is increased, the RDS(on)·Area of the transistor device is decreased.

The semiconductor substrate may be formed of silicon, for example single crystal silicon or an epitaxial layer of silicon.

As used herein, the transistor device is described as including a source, a drain, and a gate. As used herein, the electrodes or terminals of the transistor device are referred to as source, drain and gate. Therefore, these terms also encompass the functionally equivalent terminals of other types of devices, such as an insulated gate bipolar transistor. For example, as used herein, the term "source" encompasses not only a source of a MOSFET device but also an emitter of an insulator gate bipolar transistor (IGBT) device and an emitter of a BJT device, the term "drain" encompasses not only a drain of a MOSFET device but also a collector of an insulator gate bipolar transistor (IGBT) device and a collector of a BJT device, and the term "gate" encompasses not only a gate of the MOSFET device but also a gate of an insulator gate bipolar transistor (IGBT) device and a base of a BJT device.

Since the trenches for the field plate have a columnar form, the field plate also has a columnar form. Columnar describes a shape in which the depth of the trench from the front surface is larger than its width and breadth, for example at least twice as large as its width and breadth, as opposed to a stripe-shaped trench structure which is longer than it is deeper. The terms "needle-shaped" and "spicular-shaped" are used interchangeably with "columnar" to describe such a trench structure formed in a semiconductor substrate that has a small or narrow circumference or width in proportion to its height/depth in the substrate.

The columnar trenches and consequently the columnar field plates arranged therein are typically arranged in a regular array, for example a square grid array of rows and columns, or in staggered rows and columns or in a hexagonal array.

The source pad is arranged laterally adjacent and spaced apart from the gate pad on the front surface of the semiconductor substrate and is also arranged above the active area and some of the active transistor cells. Substantially the entire lateral area of the source pad may be arranged above the active area.

In some embodiments, one or more gate pads and one or more source pads are provided in the metallisation structure. In embodiments comprising two or more gate pads, a portion of each of the gate pads is arranged above the active area. The one or more source pads are also arranged above the active area.

A drain pad may be arranged on the rear surface of the semiconductor substrate, the rear surface opposing the front surface. This arrangement may be used for a vertical transistor device which has a drift path extending perpendicularly to the front surface.

In some embodiments, the transistor device further comprises a first contact to each of the columnar field plates, a second contact to each of the mesas and a first electrically conductive layer arranged on the first surface of the semiconductor substrate. The first and second contacts are electrically connected by the first electrically conductive layer. The first electrically conductive layer is electrically connected to the source pad. At least a region of the source pad may be in direct contact with the first electrically conductive layer. The first electrically conductive layer is positioned under the gate pad and under the source pad and provides a lateral electrically conductive path between the first and second contacts and, therefore, between the field plates and the mesas. The first electrically conductive layer thus also provides a lateral conductive redistribution structure from the active transistor cells, in particular from the field plates and mesas that are positioned under the gate pad, to the source pad that is arranged laterally adjacent the gate pad.

In some embodiments, the transistor device further comprises a first electrically insulating layer which is arranged under the gate pad and between the gate pad and the first electrically conductive layer. The first electrically insulating layer electrically insulates the gate pad from the first electrically conductive layer. As the first electrically insulating layer electrically insulates the gate pad from the underlying first electrically conductive layer, this enables the gate pad to be positioned vertically above the first electrically conductive layer whilst being electrically insulated from this first electrically conductive layer and the field plates and mesas of the active transistor cells, also those that are positioned under the gate pad, and electrically connected together by the first electrically conductive layer.

The first electrically conducting layer may extend under the gate pad and under the source pad and, in some embodiments, extends over substantially the entire active area of the semiconductor substrate. The lateral extent of the first electrically conductive layer may substantially correspond to the lateral extent of the source region of the transistor device.

In some embodiments, the first electrically insulating layer further extends under a peripheral region of the source pad, for example a peripheral region of the source pad that is arranged laterally adjacent, facing towards and spaced apart from an edge of the gate pad. This arrangement may be used to improve the electrical insulation of the peripheral edge of the gate pad which faces towards the source pad from the first electrically conducting layer.

In some embodiments, the first electrically insulating layer comprises a first sublayer arranged on the first electrically conductive layer and a second sublayer arranged on the first sublayer. In some embodiments, the first sublayer comprises silicon nitride and the second sublayer comprises silicon oxide. This arrangement may be used to improve the adhesion of the insulating material to the adjoining surfaces of the first electrically conductive layer and the gate pad.

In some embodiments, the transistor device further comprises a second electrically insulating layer that is arranged on the first electrically insulating layer. The second electrically insulating layer is arranged laterally between the gate pad and the source pad. In some embodiments, the second electrically insulating layer further extends over peripheral portions of the gate pad and of the source pad.

In some embodiments, the gate pad comprises a first electrically conductive sublayer arranged on the first electrically insulating layer and a second electrically conductive sublayer arranged on the first electrically conductive sublayer.

In some embodiments, the second electrically insulating layer extends over peripheral portions of the first electrically conductive sublayer of the gate pad and the second electrically conductive sublayer of the gate pad extends over peripheral regions of the second electrically insulating layer.

In some embodiments, the first electrically conductive layer comprises tungsten, the first electrically conductive sublayer of the gate pad is formed of an aluminium copper alloy and the second electrically conductive sublayer of the gate pad is formed of copper.

Other metallization structures formed of other materials may be used. The metallization structure may also include additional layers, for example, an outermost layer on the source and gate pad may be used to provide improved bonding to a wire bond or improved wetting to solder, e.g. a soft solder.

In some embodiments, the source pad comprises a first electrically conductive sublayer arranged on the first electrically conductive layer and a second electrically conductive sublayer arranged on the first electrically conductive sublayer.

In some embodiments, the first electrically conductive layer comprises tungsten, the first electrically conductive sublayer of the source pad is formed of an aluminium copper alloy and the second electrically conductive sublayer of the source pad is formed of copper.

In some embodiments, the second electrically insulating layer extends over peripheral regions of the first electrically conductive sublayer of the source pad and the second electrically conductive sublayer of the source pad extends over the peripheral regions of the second electrically insulating layer.

The first and electrically conductive sublayers of the gate pad and source pad may be formed from the same deposited layer and be substantially coplanar with one another. Similarly, the second electrically conductive sublayer of the gate pad and of the source pad may be formed from the same deposited layer and may be substantially coplanar.

In some embodiments, the transistor device further comprises a gate connection structure which is arranged on the first surface of the semiconductor substrate. The gate connection structure electrically couples the gate electrodes of the active transistor cells to the gate pad. The gate connection structure may be a gate runner, for example, that is arranged laterally adjacent the one or more sides of the source pad and which extends into the gate pad. The gate connection structure may be arranged at least in part adjacent the side faces of the semiconductor substrate and on the edge termination region, i.e. above a non-active portion of the transistor device which does not include active transistor cells.

In some embodiments, the transistor device further comprises a third electrically insulating layer that is arranged between the front surface of the semiconductor substrate and the first electrically conductive layer. The first and second contacts extend from the first electrically conductive layer through the third electrically insulating layer and contact the field plates in the columnar trenches and the mesas, respectively.

The third insulating layer may include two or more sublayers. In some embodiments, the third insulating layer comprises silicon oxide.

In some embodiments, the gate electrode is arranged in a gate trench that extends from the front surface of the semiconductor substrate into the mesa. The gate trench is spaced apart from the individual columnar trenches comprising a field plate by regions of the mesa. The gate trenches and, therefore, the gate electrodes may have an elongate strip-like form such that a row of columnar trenches is arranged between two neighbouring strip-like gate trenches. In some embodiments, the gate trenches have a grid structure comprising longitudinal and transverse sections such that one columnar trench is bounded on four sides by portions of two longitudinal sections and portions of two transverse sections. In some embodiments, the gate trench and, therefore, the gate electrode has a hexagonal form in top view or may have a ring-shape.

In some embodiments, the gate electrode is arranged on the front surface of the semiconductor substrate, rather than being arranged in the gate trench, and is positioned on and above the mesa. This arrangement may be referred to as a planar gate. The planar gate electrode may have an elongate strip-like form such that a row of columnar trenches is arranged between two neighbouring strip-like gate electrodes. The planar gate may have a grid structure comprising longitudinal and transverse sections such that one columnar trench is bounded on four sides by portions of two longitudinal sections and portions of two transverse sections. In some embodiments, the planar gate electrode has a hexagonal form in top view or may have a ring-shape in top view.

The gate electrode may be formed of the electrically conductive material such as poly silicon or may be formed of a metal.

The transistor device may be a vertical transistor device having a vertical drift path extending in a direction from the front surface to the rear surface of the semiconductor substrate, whereby the rear surface opposes the front surface. The transistor device may be a vertical power MOSFET device.

In some embodiments, each mesa of the active transistor cells comprises a drain region of a first conductivity type, a drift region of the first conductivity type arranged on the drain region, whereby the drain region is more highly doped than the drift region, a body region of the second conductivity type arranged on the drift region, whereby the second conductivity type opposes the first conductivity type, and a source region of the first conductivity type arranged on or in the body region. The source region is typically more highly doped with the first conductivity type than the drift region.

In embodiments including a gate trench, the gate trench extends through the source region and the body region into the drift region. Each of the columnar trenches extends from the front surface through the body region into the drift region. The depth of the columnar trenches is greater than the depth of the gate trenches. The drain region may be arranged at the rear surface of the semiconductor substrate.

In some embodiments, in which the gate electrode is arranged in a gate trench, the gate electrode is electrically insulated from the semiconductor substrate by a gate insulating layer that is arranged on sidewalls and base of the gate trench. In some embodiments, the thickness of the gate insulating layer is greater at the base of the trench than on the sidewalls. In embodiments in which the gate electrode is a planar gate electrode, the gate electrode is electrically insulated from the semiconductor substrate by a gate insulating layer that is arranged on the front surface of the semiconductor substrate, in particular a gate insulating layer that is arranged on the top surface of the mesa and between the top surface of the mesa and the planar gate electrode. The columnar trenches are also lined with an electrically insulating layer, commonly known as a field oxide, which covers the sidewalls and base of the columnar trenches and which electrically insulates the field plate from the semiconductor substrate.

In some embodiments, the transistor device further comprises an edge termination region that laterally surrounds the active area. In some embodiments, the edge termination region comprises a transition region that laterally surrounds the active region and an outer termination region that laterally surrounds the transition region. The edge termination region further comprises a plurality of inactive cells arranged in the transition region and in the outer termination region. Each inactive cell comprises a columnar termination trench comprising a field plate and a termination mesa comprising a drift region of the first conductivity type. In the transition region, the termination mesa comprises a body region of the second conductivity type that is arranged on the drift region. In the outer termination region, the drift region of the termination mesa extends to the first surface. The inactive cells do not contribute to the switching of a load and do not have a source region.

In some embodiments, the edge termination region further comprises a buried doped region of the second conductivity type that has a lateral extent such that it is positioned in the transition region and in the outer termination region. The buried doped region is positioned in the drift region and may be vertically spaced apart from the body region in the transition region.

In some embodiments, the buried doped region has a lateral extent and comprises an inner edge that is positioned under the body region in the transition region and an outer edge that is positioned outside of the plurality of inactive cells in the outer edge termination region.

In some embodiments, the edge termination region further comprises a continuous trench which is positioned laterally outside of the plurality of inactive cells in the outer termination region. The buried doped region may have an outer edge that is positioned laterally outside of the continuous trench as well as the plurality of inactive cells located in the outer termination region. The outermost peripheral region of the edge termination region that is positioned between the continuous trench and the side face of the semiconductor substrate may be free of trenches.

In some embodiments, in the transition region, the buried doped region is vertically spaced apart from the body region of the termination mesa by a portion of the drift region. In some embodiments, in the transition region, the body region of the termination mesas extends to the front surface of the semiconductor substrate.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

Figure 1A:
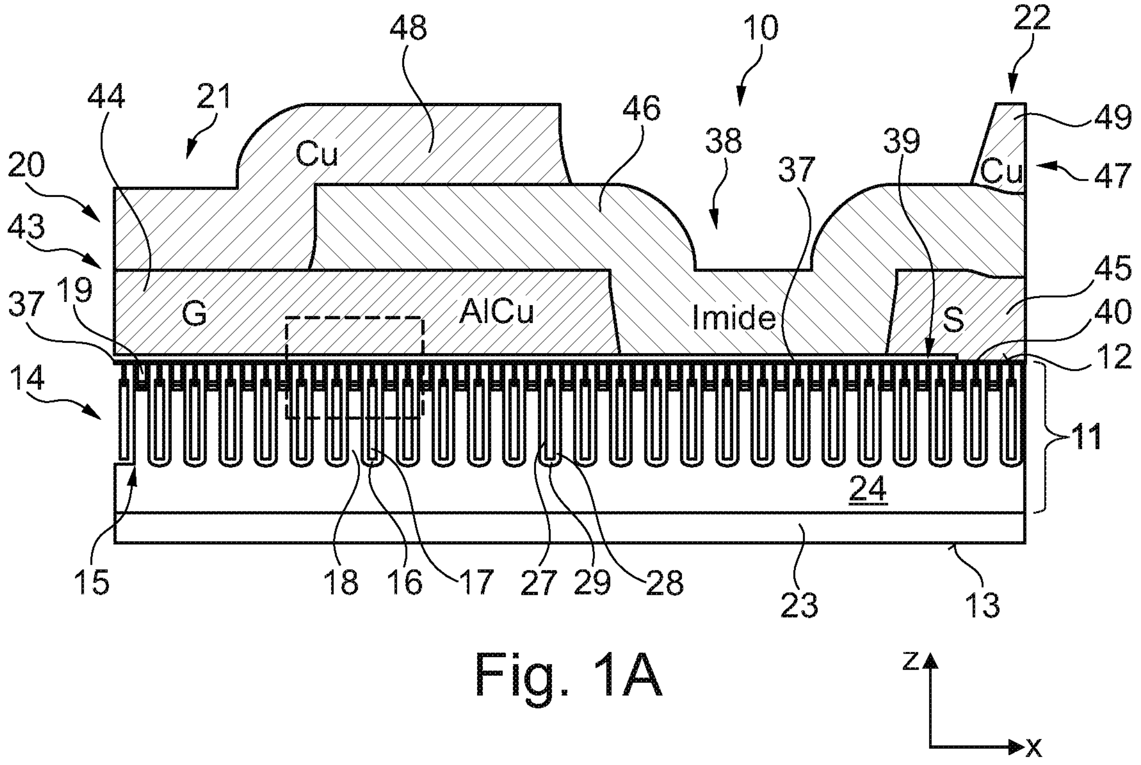
FIG. 1A illustrates a cross-sectional view of a portion of a transistor device with a trench gate.

In the following detailed description, reference is made to the accompanying drawings, which form a part hereof, and in which is shown by way of illustration specific embodiments in which the invention may be practiced. In this regard, directional terminology, such as “top”, “bottom”, “front”, “back”, “leading”, “trailing”, etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, “lateral” or “lateral direction” should be understood to mean a direction or extent that runs generally parallel to the lateral extent of a semiconductor material or semiconductor carrier, i.e. parallel to the front surface of the semiconductor substrate described herein. The lateral direction thus extends generally parallel to these surfaces or sides. In contrast thereto, the term “vertical” or “vertical direction” is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being “on” or extending “onto” another element, it can be directly on or extend directly onto the other element or intervening elements may also be present. In contrast, when an element is referred to as being “directly on” or extending “directly onto” another element, there are no intervening elements present.

As employed in this specification, when an element is referred to as being “connected” or “coupled” to another element, it can be directly connected or coupled to the other element or intervening elements may be present. In contrast, when an element is referred to as being “directly connected” or “directly coupled” to another element, there are no intervening elements present.

As used herein, various device types and/or doped semiconductor regions may be identified as being of n type or p type, but this is merely for convenience of description and not intended to be limiting, and such identification may be replaced by the more general description of being of a “first conductivity type” or a “second, opposite conductivity type” where the first type may be either n or p type and the second type then is either p or n type.

The FIGURES illustrate relative doping concentrations by indicating “−” or “+” next to the doping type “n” or “p”. For example, “$n^-$” means a doping concentration which is lower than the doping concentration of an “n”-doping region while an “$n^+$”-doping region has a higher doping concentration than an “n”-doping region. Doping regions of the same relative doping concentration do not necessarily have the same absolute doping concentration. For example, two different “n”-doping regions may have the same or different absolute doping concentrations.

Some types of transistor device, such as a MOSFET, include a cell field comprising a plurality of substantially identical transistor cells, each having a transistor structure. The cells are electrically connected to form a single transistor device for switching and may be referred to as active transistor cells. The cell field provides the active area of the transistor device within the semiconductor die in which the transistor device is formed. The transistor device includes an edge termination region that laterally surrounds the cell field and that has a structure that serves to reduce the peak lateral electric field between the cell field and the side faces of the transistor device, i.e. the side faces of the semiconductor die, to avoid breakdown of the semiconductor device due to edge effects and to improve the performance of the device. According to the invention, at least a part of the gate pad is arranged on the front surface of the semiconductor substrate above the active area. This enables the active area to be increased and RDS(on)·Area of the device to be reduced, without increasing the area of the semiconductor substrate.

Figure 1B:
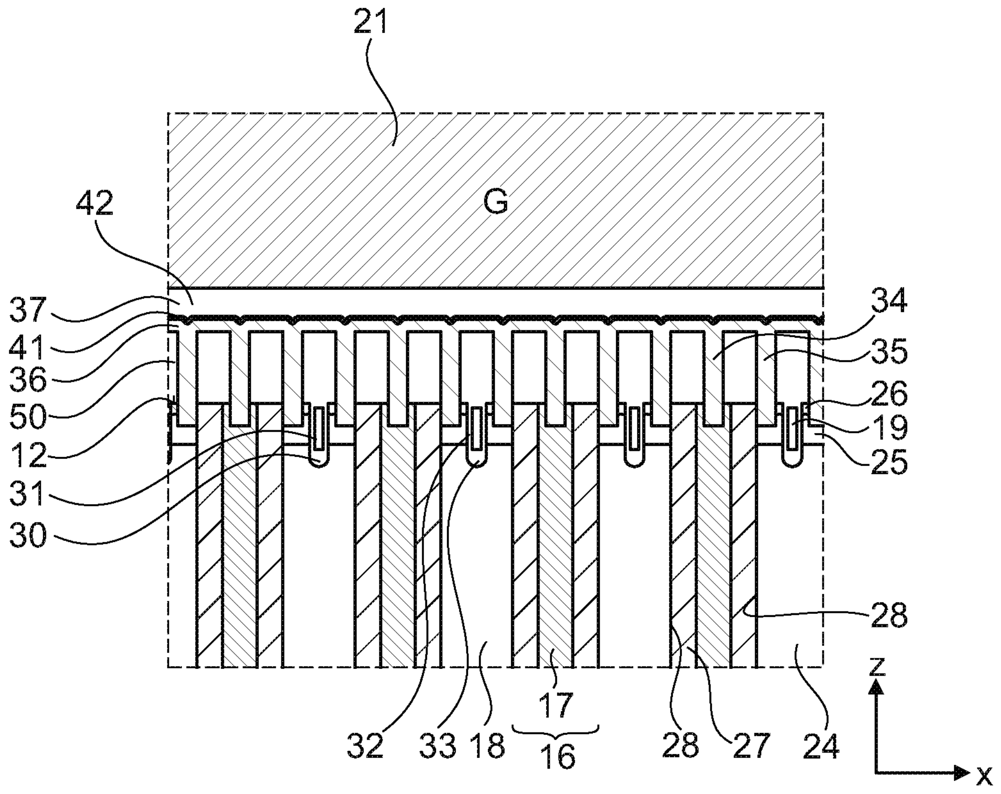
FIG. 1B illustrates an enlarged view of a portion of the transistor device of FIG. 1A.
Figure 1C:
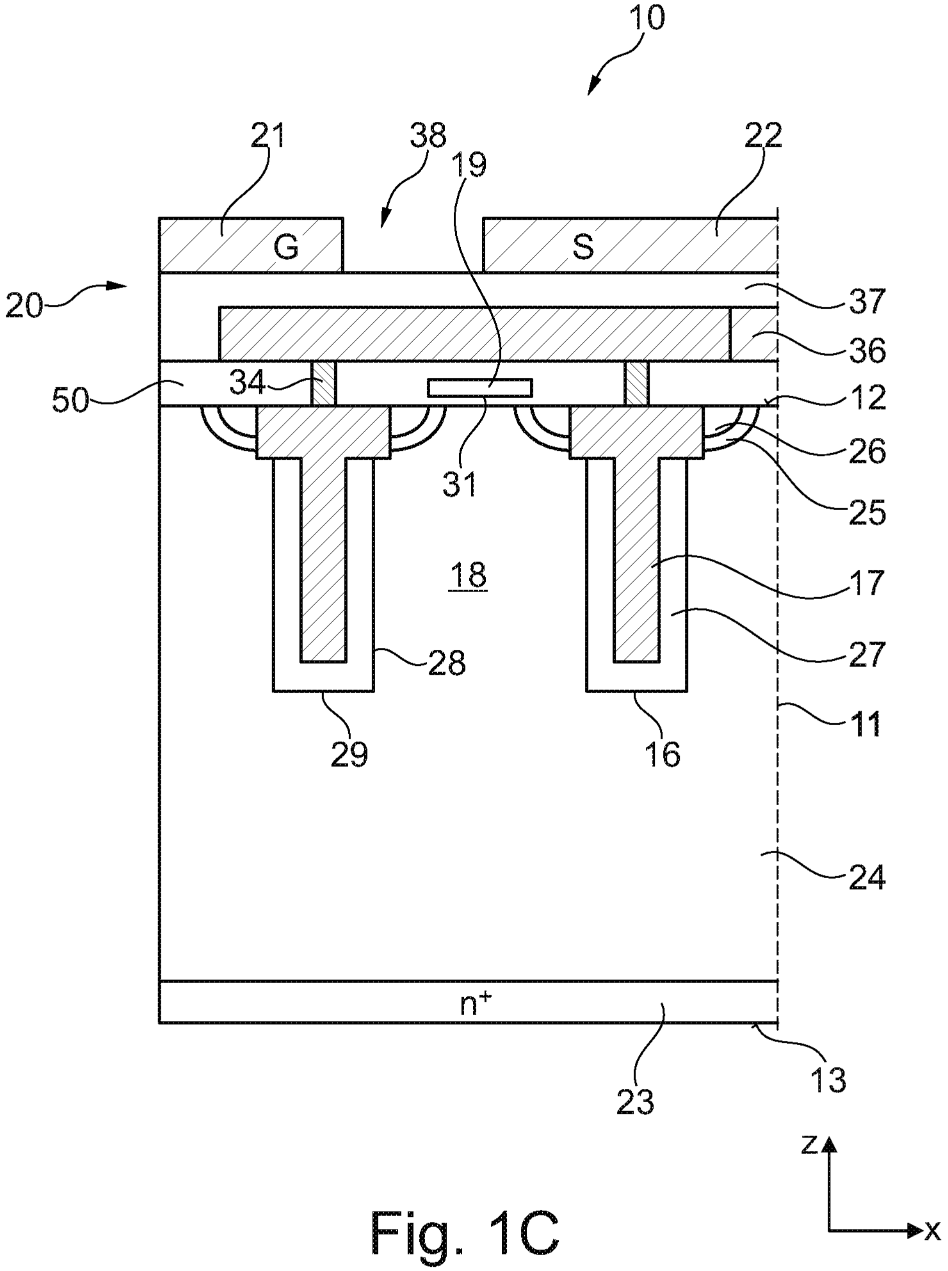
FIG. 1C illustrates a cross-sectional view of a portion of a transistor device with a planar gate.

FIG. 1A illustrates a cross-sectional view of a portion of a transistor device 10 and FIG. 1B illustrates an enlarged view of a portion of the transistor device 10 of FIG. 1A.

The transistor device 10 comprises a semiconductor substrate 11 having a front surface 12 and a rear surface 13 that opposes the front surface 12. An active area 14 is provided in the semiconductor substrate 11, the active area 14 comprising a plurality of active transistor cells 15 each comprising a columnar trench 16, a mesa 18 and a gate electrode 19. The columnar trench 16 includes a field plate 17 which also has a columnar form. The transistor device 10 further comprises a metallisation structure 20 arranged on the front surface 12 which provides a gate pad 21 and a source pad 22. At least part of the gate pad 21 is arranged above the active area 14.

The semiconductor substrate 11 may be formed of silicon, for example monocrystalline silicon or an epitaxially layer of silicon that has been deposited on a monocrystalline substrate. In some embodiments, the semiconductor substrate 11 includes a drain region 23 which is highly doped with a first conductivity type arranged at the rear surface 13, a drift region 24 which is lightly doped with the first conductivity type arranged on the drain region 23, a body region 25 which is doped with the second conductivity type which opposes the first conductivity type and which is arranged on the drift region 24 and a source region 26 which is heavily doped with first conductivity type and which is arranged on or in the body region 25 at the first front surface 12 of the semiconductor substrate 11. In some embodiments, the first conductivity type is n-type and the second conductivity type is p-type or vice versa. In some embodiments, the transistor device 10 is a vertical transistor device and has a drift path that extends perpendicularly to the front surface 12. The transistor device 10 may be a vertical power MOSFET.

The columnar trenches 16 extend into the semiconductor substrate 11 from the front surface 12 into the drift region 24 and have a base which is spaced apart from the drain region 23. The field plate 17 that is arranged in the columnar trench 16 also has a columnar form and is electrically conductive and may be formed of polysilicon for example. The field plate 17 is electrically insulated from the semiconductor substrate 11 by an electrically insulating layer 27 which lines the sidewalls 28 and base 29 of the columnar trenches 16. The mesas 18 are formed from the regions of the active area 14 of the semiconductor substrate 11 that are located between the columnar trenches 16 and comprise the drift region 24, the body region 25 and the source region 26.

The columnar trenches 16 and consequently the columnar field plates 17 arranged in the columnar trenches 16 may be arranged in a regular array, such as a regular square grid of rows and columns, or may be arranged in an array of staggered or shifted rows, in which the columnar trenches 16 of each row have the same pitch or spacing in the long direction of the row and are offset in the long direction with respect to an immediately adjacent row of the array. In some embodiments, the columnar trenches 16 are arranged in an array in which the columnar trenches have a regular pattern such as a hexagonal arrangement. The lateral form of each of the columnar trenches 16 within the array having any form or pattern may be square, octagonal, round, or hexagonal, for example. For example, the columnar trenches 16 may have a lateral octagonal form in plan view and be arranged in square grid array.

In some embodiments, such as that illustrated in FIGS. 1A and 1B, the gate electrode 19 is arranged in a gate trench 30 which is separate from the columnar trench 16 with the field plate 17. The gate trench 30 is positioned in the mesa 18. The gate trenches 30 extend from the front surface 12 through the source region 26 and body region 25 such that the gate trench 30 has a base arranged in the drift region 24. The columnar trenches 16 extend further, i.e. deeper into the semiconductor substrate 11 than the gate trenches 30. The gate trenches 30 have an elongate stripe-like form with a long direction that extends into the plane of the drawing. The gate electrodes 19 also have an elongate stripe-like form with a long direction that extends into the plane of the drawing. The gate electrode 19 is electrically insulated from the semiconductor substrate 11 by a gate insulator 31, e.g. a gate oxide, which is positioned on the sidewalls 32 and base 33 of the gate trench 30. In some embodiments, the thickness of the gate insulating layer 31 in the gate trench 31 is greater at the base 33 than on the sidewalls 32. The portion of the gate insulating layer 31 on the sidewalls 32 forms the gate insulator of the active transistor cell 15.

Figure 1D:
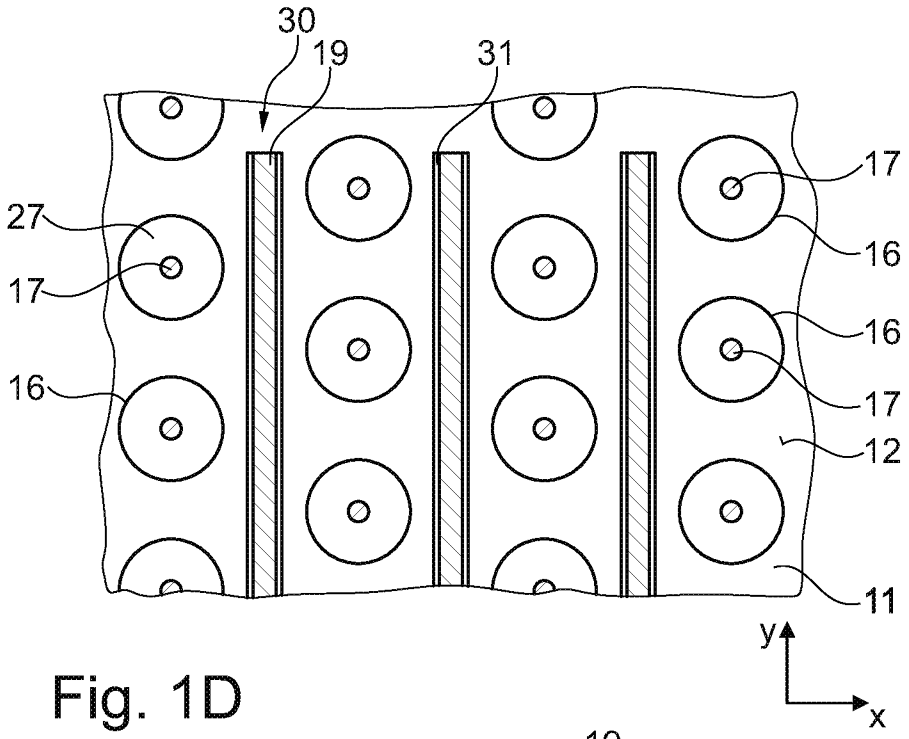
FIG. 1D illustrates a top view of a gate electrode arrangement according to an embodiment.
Figure 1E:
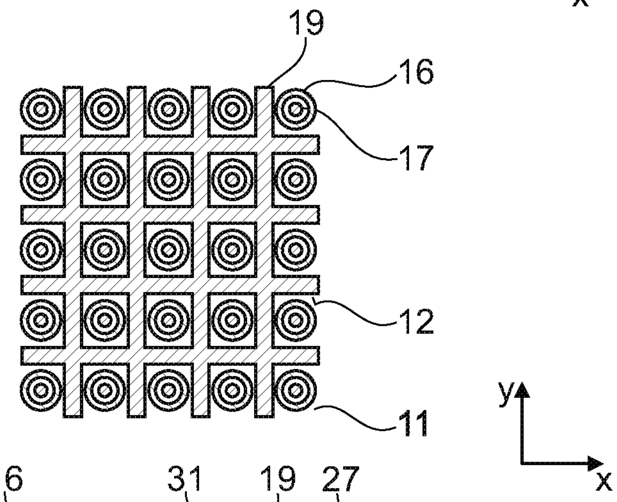
FIG. 1E illustrates a top view of a gate electrode arrangement according to an embodiment.
Figure 1F:
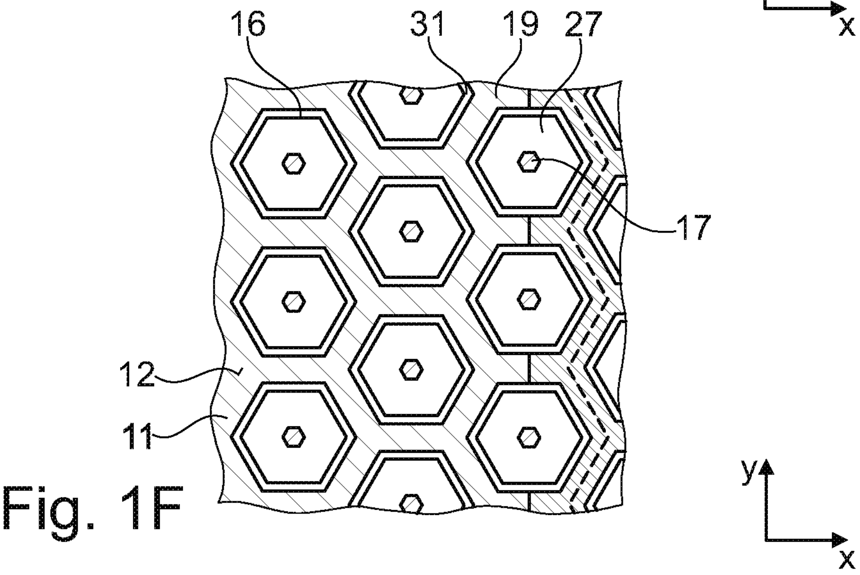
FIG. 1F illustrates a top view of a gate electrode arrangement according to an embodiment.

In some embodiments, the gate trenches 30 and the gate electrode 19 may have an elongate structure in top view, as is illustrated in the cross-sectional view of FIG. 1D, whereas the columnar trenches 16 and field plates 17 have a columnar form. In this embodiment, the columnar trenches 16, and consequently the field plates 17 are arranged in staggered rows and each have a substantially circular shape in the top view. In some embodiments, the gate electrodes 19 and gate trenches 30 form a grid of strip-like longitudinal sections and transverse sections that interconnect, as shown in FIG. 1E. In this embodiment, the columnar trenches 16 and the field plates trenches 17 are arranged in a square grid array of rows and columns having substantially the same pitch. In other embodiments, the gate trench has a hexagonal form, as shown in FIG. 1F, and laterally surrounds each columnar trench 16. In this embodiment, the columnar trenches 16 and field plates 17 each have a hexagonal shape in plan view and are arranged in a hexagonal array. In some non-illustrated embodiments, the gate electrode 19 may be discontinuous and include two or more parts that are laterally spaced apart from one another rather than continuous as shown in FIGS. 1D to 1F.

In other embodiments, such as that illustrated in FIG. 10, the gate electrode 19 has the form of a planar gate which is arranged on the front surface of 12 of the semiconductor substrate 11 on the mesas 18. The gate electrode 19 is electrically insulated from the front surface 12 by a gate insulating layer 31 that is arranged on the front surface 12 of the semiconductor substrate with the planar gate electrode 19 arranged on the gate insulating layer 31. The long direction of the planar gate electrode 19 extends into the plane of the drawing and may be extend parallel to one another and be positioned on two opposing sides of the columnar trenches 16 or may interconnect to form a grid structure and be laterally positioned adjacent more than two sides or on all sides of the columnar trench 16. In top view, the planar gate electrode 19 may have a stripe form, a grid form or a hexagonal form as shown in FIGS. 1D, 1E and 1F, respectively.

Referring to FIGS. 1A to 10, the gate pad 21 and the source pad 22 of the metallization structure 20 are arranged on the front surface 12 of the semiconductor substrate 11 and are laterally spaced apart from another by a gap 38. The gate pad 21 is electrically coupled to the gate electrodes 19 and the source pad 22 is electrically coupled to not only the source regions 26 but also to the columnar field plates 17 arranged in the columnar trenches 16.

The transistor device 10 further comprises at least one first contact 34 to each of the field plates 17 and at least one second contact 35 to each of the mesas 18. The transistor device 10 further includes a first electrically conductive layer 36 which is arranged on the front surface 12 of the semiconductor substrate 11. The first contacts 34 and the second contacts 35 are electrically connected to one another by the first conductive layer 36. The first and second contacts 34, 35 may extend in a vertical direction, i.e. z-direction using Cartesian coordinates, with the first conductive layer 36 providing a lateral conductive redistribution connection, i.e. in the x-y plane using Cartesian coordinates. The first electrically conductive layer 36 is positioned under the gate pad 21 and under the source pad 22, as can be seen in the cross-sectional views of FIGS. 1A to 1C.

The transistor device 10 further includes a first insulating layer 37 which is arranged under the gate pad 21 and between the gate pads 21 and the first electrically conductive layer 36 so as to electrically insulate the gate pad 21 from the underlying first conductive layer 36 and consequently to electrically insulate the gate pad 21 from the field plates 17 and mesas 18 to which the first conductive layer 36 and the first and second contacts 34, 35, respectively, are electrically connected. This arrangement enables the active area 14 including the active transistor cells 15 to be positioned underneath the gate pad 21 and therefore to enable the active area 14 to occupy a larger proportion of the total area of the semiconductor substrate 11. This assists in reducing the parameter RDSon·Area of the transistor device 10.

Referring to FIG. 1A, in some embodiments, the first electrically insulating layer 37 also extends over the gap 38 between the gate pad 21 and the source pad 22 and also under a peripheral region 39 of the source pad 22 which faces towards the gate pad 21. The remaining portion 40 of the source pad 22 is, however, to positioned directly on and electrically connected to the first electrically conductive layer 36 so as to electrically couple the source pad 22 to the source region 26, body region 27 and field plate 17 of the active transistor cells 15 and also to the active transistor cells 15 positioned directly under the gate pad 21.

The first insulating layer 37 may comprise two or more sublayers. For example, referring to FIG. 1B, the first insulating layer 37 may include a first sublayer 41 which is positioned on the first conductive layer 36 and a second sublayer 42 which is positioned on the first sublayer 41. In an embodiment, the first sublayer 41 is formed of silicon nitride and the second sublayer 42 is formed of silicon oxide. The second sublayer may be in direct contact with the gate pad 21.

The metallisation structure 20 formed on the front surface 12 the semiconductor substrate 11 which provides the gate pad 21 and the source pad 22 will now be described in more detail with reference to FIG. 1A. The metallisation structure 20 includes a first electrically conductive sublayer 43 which is arranged on the first insulating layer 37 and which is structured to form a first sublayer 44 of the gate pad 21 and a first sublayer 45 of the source pad 11 that are laterally spaced apart from one another by the gap 38. This first sublayer 44 of the gate pad 21 is electrically insulated from the underlying first conductive layer 36 by the first insulating layer 37. The first electrically conductive sublayer 45 of the source pad 22 is arranged on the front surface 12 such that its peripheral region 39 is positioned on and overlaps a peripheral region of the Resonate first electrically insulating layer 37 and such that the remaining portion 40 is in direct contact with the first conductive layer 36.

The metallisation structure 20 further includes a second electrically insulating layer 46 which is arranged on the front surface 12 and which is positioned on peripheral regions of the first sublayer 43 of the gate pad 21 and peripheral regions of the first sublayer 45 of the source pad 22 and which extends over the gap 38 between the first and second sublayers 44, 45 of the gate pad 21 and source pad 22. In this region between the first and second sublayers 44, 45 of the gate pad 21 and source pad 22, the second insulating layer 46 is positioned directly on the first insulating layer 37.

The metallisation structure 20 further comprises a second electrically conductive sublayer 47 which is structured so as to provide a second electrically conductive sublayer 48 of the gate pad 21 and a second electrically conductive sublayer 49 of the source pad 22 that are laterally spaced apart from one another by the gap 38. The second electrically conductive sublayer 48 of the gate pad 21 has a peripheral region which is arranged on the second insulating layer 46 at positions vertically above the first sublayer 44 and which extends onto and is in direct contact with the first sublayer 44 such that the second sublayer 48 and the first sublayer 44 together form the gate pad 21 and are electrically coupled to the gate electrodes 19.

The source pad 22 also includes a second electrically conductive sublayer 49 which is positioned on and overlaps the peripheral region of the second insulating layer 46 which is positioned on the peripheral region of the first sublayer 45 of the source pad 22. The second sublayer 49 extends onto and is in direct contact with the first sublayer 45 of the source pad 22. The source pad 22 therefore is also formed of two sublayers 45, 49 which are electrically coupled to the source region 26, body region 25 and field plates 17 by way of the electrically conductive layer 36 that extends under the gate pad 21 and the first and second contacts 34, 35.

The first electrically conductive sublayer 43 may be formed of an aluminium copper alloy and the second electrically conductive sublayer 47 may be formed of copper. The second insulating layer 46 may be formed of polyimide and the first conductive layer 36 and the first and second contacts 34, 35 may be formed of tungsten. In some embodiments, the first conductive layer 36 and the first and second contacts 34, 35 may also comprise two or more sublayers. For example, a barrier structure of Ti, TiN may be formed onto which the tungsten is deposited.

The transistor device 10 further includes a third electrically insulating layer 50 which is positioned on the front surface 12 of the semiconductor substrate 11 and between the front surface 12 and the first conductive layer 36. The first and second contacts 34, 35, therefore, extend through the third insulating layer 30. The third insulating layer may be formed of silicon oxide.

The gate electrodes 19 are electrically connected to one another by a gate connection structure which is positioned on the front surface 12 of the semiconductor substrate 11 in a plane which cannot be seen in the cross-sectional view of FIGS. 1A to 10. For example, the gate connection structure may include a gate runner which is positioned laterally adjacent the source pad 22 and which is connected to the gate electrodes 19 by one or more vias which extend into the front surface 12 at a position laterally adjacent the source pad 22 to the individual gate electrodes 19 to electrically connect the gate electrodes 19 to the gate runner which extends into and is electrically connected to the gate pad 21.

Figure 1G:
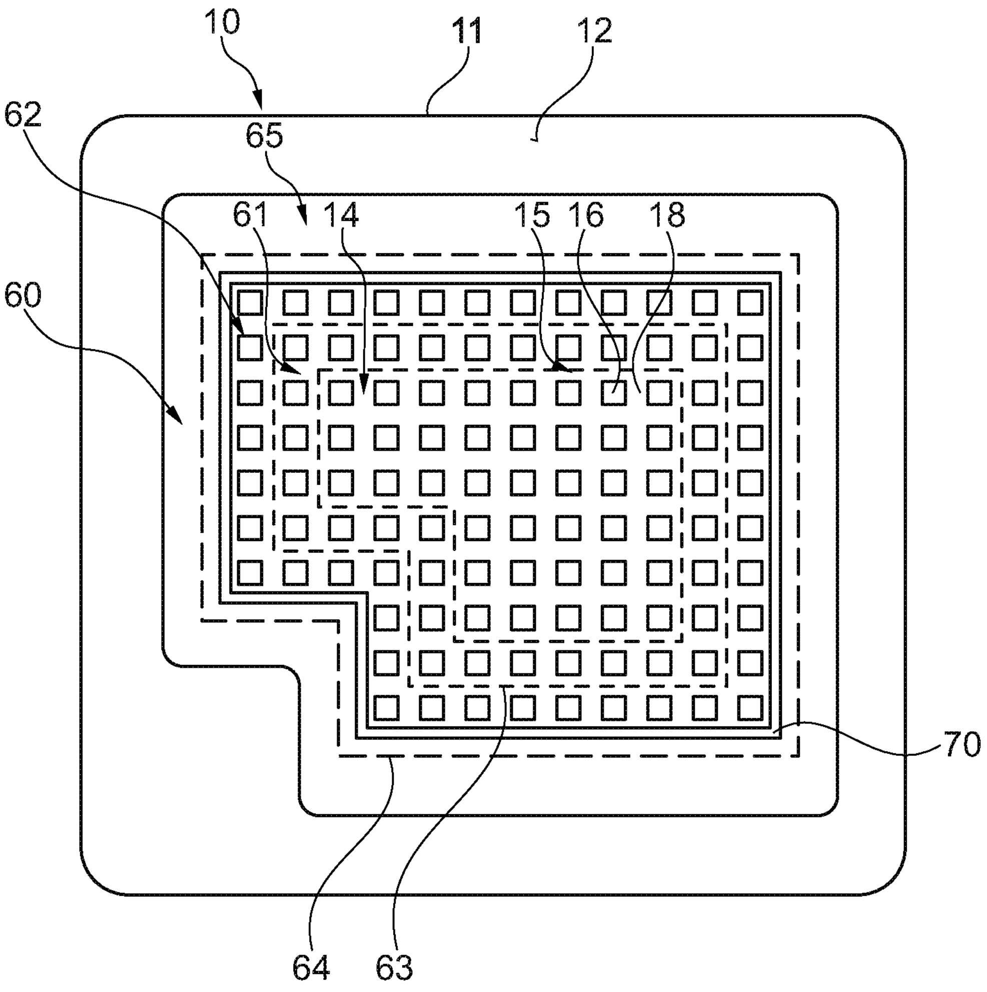
FIG. 1G illustrates a top view of a transistor device.

FIG. 1G illustrates a plan view of the front surface 12 of the transistor device 10 and illustrates that the transistor device 10 further includes an edge termination region 60 in the semiconductor substrate 11 which laterally surrounds the active area 14. The metallization structure 20 is not shown in the plan view of FIG. 1G.

The edge termination region 60 does not include any active transistor cells. The edge termination region 60 serves to reduce the peak lateral electric field between the cell field 14 and the side faces of the transistor device 10, i.e. the side faces of the semiconductor substrate 11, to avoid breakdown of the transistor device 10 due to edge effects and to improve the performance of the device. The edge termination region 60 may have different edge termination structures.

Figure 1H:
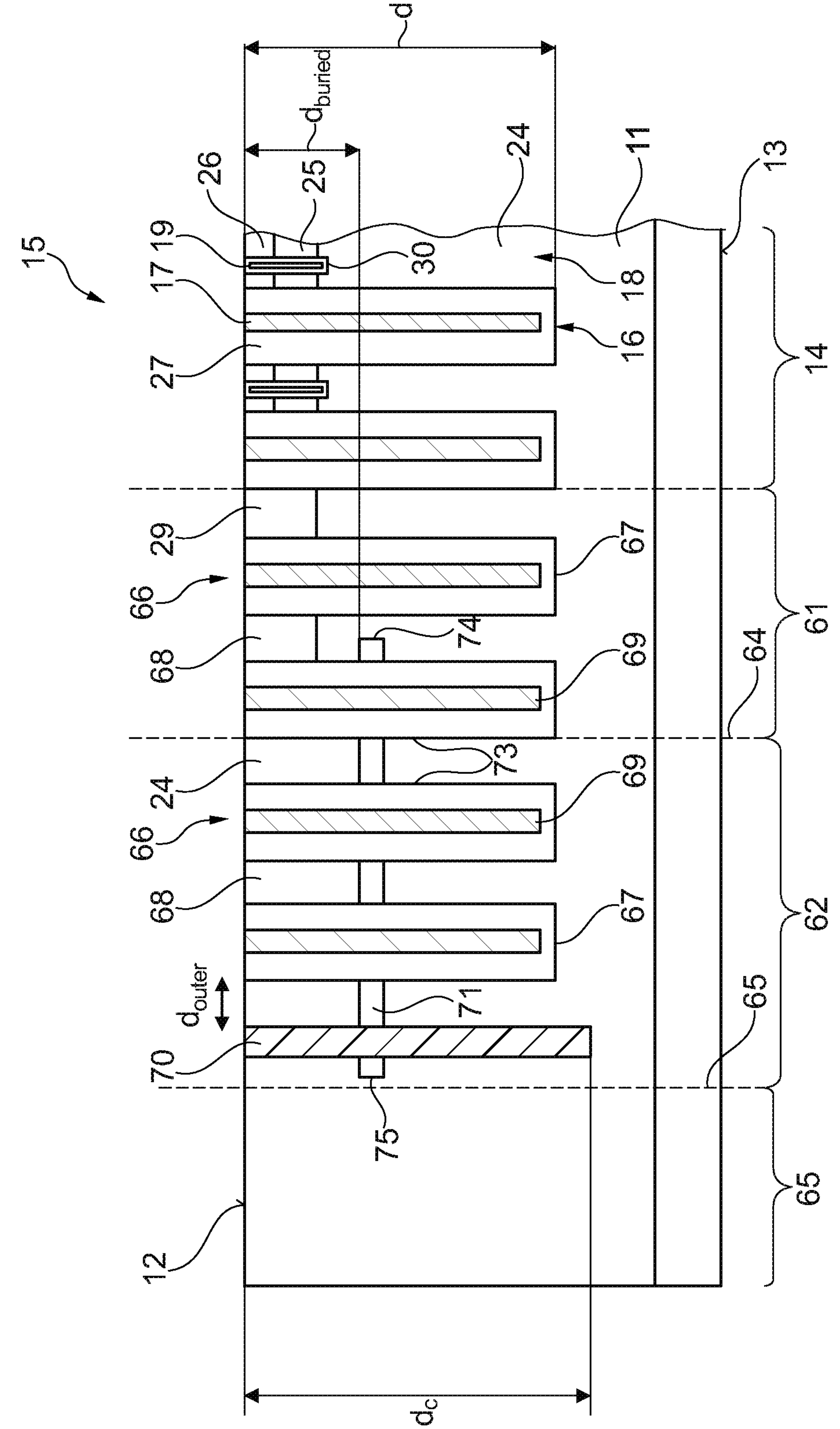
FIG. 1H illustrates a cross-sectional view of an edge termination region of the transistor device of FIG. 1G.

FIG. 1H illustrates a cross-sectional view of an example of an edge termination region 60 which may be used for the transistor device 10. The edge termination region 60 moves avalanche breakdown into the active cell area greatly improving the avalanche performance. As it is not necessary to alter the design of the active transistor cells 15 to provide an effective termination structure, the structure of the active transistor cells 15 can be optimized to achieve better Ron·Area and switching characteristics. As the edge termination structure 60 is small, a larger active area and, therefore, a better Ron·Area is achieved. Additionally, no unnecessary termination capacitance is introduced, thus improving Qoss.

The edge termination region 60 comprises three concentric regions and includes a transition region 61 which laterally surrounds the active region 14 and an outer termination region 62 which laterally surrounds the transition region 61 and an outer region 65 that laterally surrounds the outer termination region 62. The boundary between the transition region 61 and the outer termination region 62 is indicated by the dashed line 63 and the boundary between the outer termination region 62 and the outer region 65 is indicated by the dashed line 64 in FIGS. 1G and 1H.

The transition region 61 and the outer transition region 62 of the edge termination region 60 comprise a plurality of inactive cells 66. Each inactive cell 66 comprises a columnar termination trench 67 and a termination mesa 68. The columnar termination trench 67 also comprises a field plate 69 having a columnar form. The termination mesa 68 includes the drift region 24 of the first conductivity type.

The edge termination region 60 further includes at least one continuous trench 70 that is positioned in the outer termination region 62. The continuous trench 70 is filled with dielectric material and laterally surrounds the columnar termination trenches 67. The continuous trench 70 continuously and uninterruptedly laterally surrounds the columnar termination trenches 67 and the inactive cells 66. The columnar termination trenches 67 and the columnar trenches 16 of the active cells 14 may be arranged in an array, for example a grid of rows and columns. The continuous trench 70 laterally surrounds and is arranged at the periphery of this array, i.e. between the array of columnar edge termination trenches 67 and the side faces of the semiconductor substrate 11. The continuous trench 70 is free of electrically conductive material and does not include a field plate.

In some embodiments, the continuous trench 70 is spaced apart from a laterally outermost one of the columnar termination trenches 67 by a distance $d_{outer}$. $d_{outer}$ may be 50 nm≤$d_{outer}$≤2 μm. The distance $d_{outer}$ is measured adjacent to the side faces rather than at the corners of the semiconductor substrate 11. The continuous trench 70 is filled with at least one dielectric material. In contrast to the columnar termination trenches 67, the continuous trench 70 is free of electrically conductive material and, therefore, free of a field plate. The dielectric material positioned in the continuous trench 70 has a dielectric constant $\varepsilon_r$ which is lower than the dielectric constant of silicon which has $\varepsilon_r$ of 11.7. Possible dielectric materials for the continuous trench 50 include $SiO_2$ with $\varepsilon_r$ around 2.66, a vacuum with $\varepsilon_r$ of 1.0 and silicon nitride with $\varepsilon_r$ of around 6.0. The continuous trench 70 may have different structures. In some embodiments, the continuous trench 70 is entirely filled with a solid dielectric material, such as an oxide, e.g. silicon oxide, or a nitride. The continuous trench 70 may be entirely filled with a single solid dielectric material or with two or more solid dielectric materials of differing composition.

In some embodiments, the columnar termination trenches 67 and the columnar trenches 16 in the active region 14 have the same depth, i.e. have a base or bottom that is positioned at approximately the same distance from the first surface 12. In other embodiments, the columnar termination trenches 67 in the transition region 61 and outer transition region 62 have a greater depth than the columnar trenches 16 in the active region 14.

FIG. 1H illustrates a cross-sectional view of a portion of the transistor device 10 and illustrates a portion of the active area 14 and the edge termination region 67 including the transition region 61, the termination region 62 and the outer region 65.

In the active area 14, the mesas 18 comprise the drift region 24 of a first conductivity type, a body region 25 of a second conductive type that opposes the first conductivity type that is arranged on the drift region 24 and a source region 26 of the first conductive type that is arranged on the body region 25 and that extends to the first surface 12.

In the transition region 61, the termination mesa 68 comprises the body region 25 of the second conductivity type that is arranged on the drift region 24. In the transition region 61, the body region 25 extends to the first surface 12 of the semiconductor substrate 11 so that no source region is provided. These cells are, therefore, inactive.

In the outer termination region 62, the drift region 24 of the termination mesas 68 extends to the first surface 12 of the semiconductor substrate 11. The termination mesas 68 in the outer termination region 62, in contrast to the termination mesas 68 in the transition region 61, do not include a body region.

The transition region 61 is distinguishable from the outer termination region 62 by the presence of the body region 25. The source region 26 is laterally smaller than the body region 25. The lateral extent of the body region 25, as defined by the outer edge of the body region 25, is less than the lateral extent of the drift region 24 and the first surface 12. The outer termination region 65 that surrounds and, in particular, is contiguous with the outer termination region 62 is free of inactive cells. Therefore, the outer termination region 65 is free of columnar trenches and mesas. The outer termination region 65 may include semiconductor material of the first conductivity type.

In some embodiments, such as that illustrated in FIG. 1H, the edge termination region 60 further comprises a buried doped region 71 which can be seen in the cross-sectional view of FIG. 1G. The buried doped region 71 has a lateral extent such that it is positioned in both the transition region 61 and in the outer termination 62 of the edge termination region 60. The buried doped region 71 comprises the second conductivity type. The continuous trench 70 extends through the buried doped region 71. The buried doped region 71 extends between the sidewalls 73 of at least some of the columnar termination trenches 67 and the continuous trench 70. The buried doped region 71 forms a portion of the sidewalls 73 of at least some of the columnar termination trenches 67 and a portion of the two opposing elongate side walls of the continuous trench 70.

The buried doped region 71 is positioned within the semiconductor substrate 11 at a distance from the first major surface 12 and has the form of a single doped region. The buried doped region 71 may have a substantially uniform thickness. The buried doped layer 71 may have the form of a plate-like layer that is bounded above and below by portions of the drift region 24 and that is spaced apart from the front side 12 and from the rear side 13. This plate-like buried doped layer 71 may also have a uniform thickness. In some embodiments, the buried doped layer 71 may be spaced apart from the body region 25 by a portion of the drift region 24.

In some embodiments, a portion of the buried doped layer 71 is spaced apart from the body region 25 by a portion of the drift region 24 and vertically overlaps a portion of the body region 25.

The buried doped layer 71 is doped with the second conductivity type, e.g. p-type, whereas the drift region 24 is doped with the first conductivity type, e.g. n-type. The buried doped layer 71 can be considered to provide a counter doping layer. In some embodiments, the doped buried layer has a doping concentration of 1e14-1e17/$cm^3$ which may be produced from an implant of 1e11-1e13/$cm^2$ and the drift region a doping concentration of 1e14-1e17/$cm^3$.

The lateral extent of the buried doped layer 71 may be defined by an inner edge 74 and an outer edge 75. In some embodiments, the buried doped region 71 comprises an inner edge 74 that is positioned in the transition region 61 of the edge termination region 60 and is positioned under the body region 25 of the termination mesa 68. The buried doped region 71 is vertically spaced apart from the body region 25 of the termination mesa 68 by a portion of the drift region 24. In some embodiments, the inner edge 74 of the buried doped region 71 may be arranged such that the buried doped region 71 is positioned underneath the body region 25 that is positioned in two or more neighbouring termination mesas 68.

In at least some of the transition region 61, the body region 25 does not vertically overlap with the buried doped region 71. In particular, the portion of the body region 25 that is laterally positioned nearer to the active area 14 does not vertically overlap with the buried doped region 71. The inner edge 74 of the buried doped region 71 is laterally spaced apart from the active area 15 by at least one inactive cell 66 including a columnar termination trench 67 and termination mesa 68. In some embodiments, one or more termination mesas 68, which are laterally contiguous to the active region 14, have a structure such that the drift region 24 extends without interruption to the body region 25 and are free of the buried doped region 71.

In some embodiments, the buried doped region 71 has an outer edge 75 that is positioned in the outer region 65 of the edge termination region 60 so that the buried doped region 71 extends from within the transition region 61, over the entire width of the intermediately situated outer termination region 62 and into the outer region 65 which is free of inactive cells. The outer edge 75 of the buried doped region 71 is positioned laterally between the side face of the semiconductor substrate and the continuous trench 70. Thus, the continuous trench 70 extends through and interrupts the doped buried layer 71 such that the doped buried layer 71 forms a portion of the opposing side walls of the continuous trench 70.

The buried doped region 71 forms a portion of the sidewalls of at least two laterally adjacent rows of columnar termination trenches 67, whereby one row is positioned in the transition region 61 and the other row is positioned in the outer termination region 62, since the buried doped region 71 has a lateral extent such that it is positioned in both the transition region 61 and in the outer termination region 62 of the edge termination region 60.

The buried doped region 71 may have the form of a continuous ring when viewed from above that is positioned laterally adjacent all sides of the active area 14 and continuously laterally surrounds the active area 14.

In some embodiments, this additional buried doped region 71 has the following combination of properties: it is fully depletable in order to locally relax the electric field, it laterally extends under the outer end of the body region 25 in the transition region 61 in order to avoid an early breakdown at the curvature at the end of the body region 25 and it extends laterally towards the side faces of the semiconductor substrate 11 into the outer termination region 65, which includes no columnar trenches with field plates, in order to 'stretch' the potential lines at the outer side of the termination structure and to relax the electric field at the laterally outermost trench 67 of the edge termination region 60 so as to avoid an early breakdown at this location.

The continuous trench 70 may extend through the buried doped region 71. The spacing of the continuous trench 70 from the active area 14 of the device 10 can be increased by adding such a counter doping implant. This has been found to be beneficial at lower voltage classes. The counter doping implant may be used to increase the process window and to allow the dielectric filled continuous trench to be spaced much further away from the columnar termination trenches. This enables the stress that is caused by the inclusion of the dielectric filled continuous trench 70 in the edge termination region 60 and that is transferred to the active area of the transistor device 10 to be reduced or even eliminated.

The combination of the continuous dielectric filled trench 70 and doped buried region 61 in the edge termination region 60 provides an edge termination structure that moves avalanche breakdown into the active cell area greatly improving the avalanche performance. As the edge termination structure is small, a larger active area and, therefore, a better Ron·Area is achieved. The transistor cell structure may be further optimized to achieve better Ron·Area and switching characteristics.

FIGS. 2A to 2E illustrate top views of the transistor device 10 of FIGS. 1A to 1H and the lateral arrangement of layers of the metallisation structure 20 of the transistor device 10.

Figure 2A:
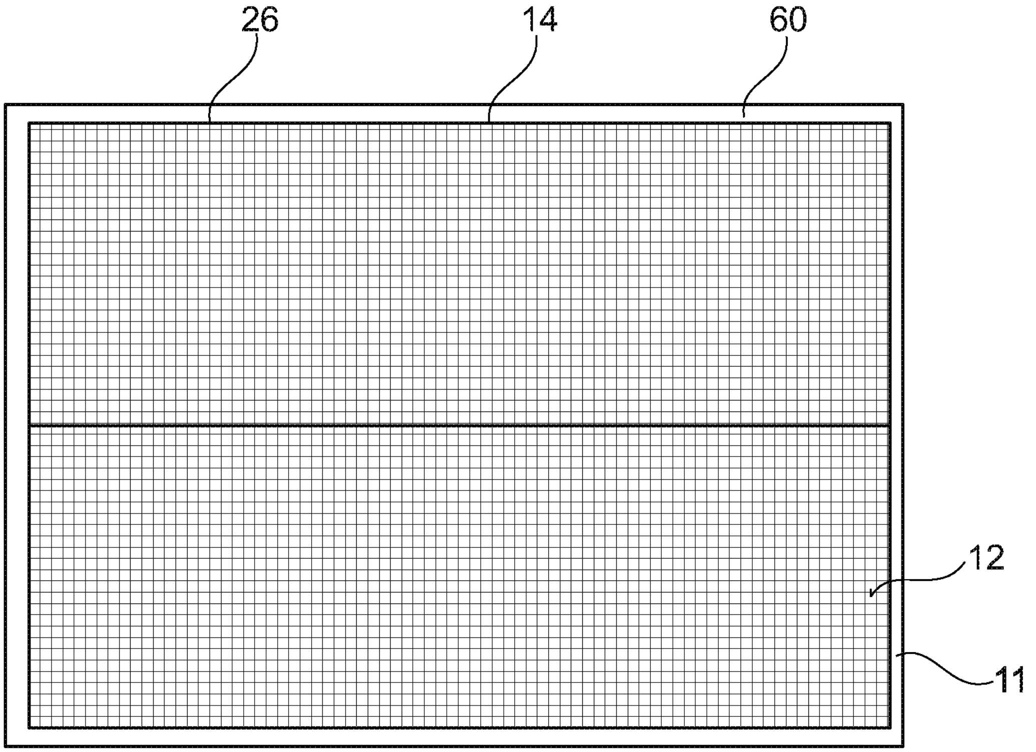
FIGS. 2A to 2E illustrate top views of various layers of metallisation structure of the transistor device of FIGS. 1A to 1H.

FIG. 2A illustrates a top view of the front surface 12 of the semiconductor substrate 11. The active area 14 extends over substantially the entire front surface 12 and is laterally surrounded on all sides by the edge termination region 60. The area of the front surface 12 which is implanted with dopants of the first conductivity type to form the source region 26 of the active transistor cells 15 corresponds to the active area 14. Therefore, only a narrow edge region at the periphery of the front surface 12 is free of the source region and forms the edge termination region 60.

Figure 2B:
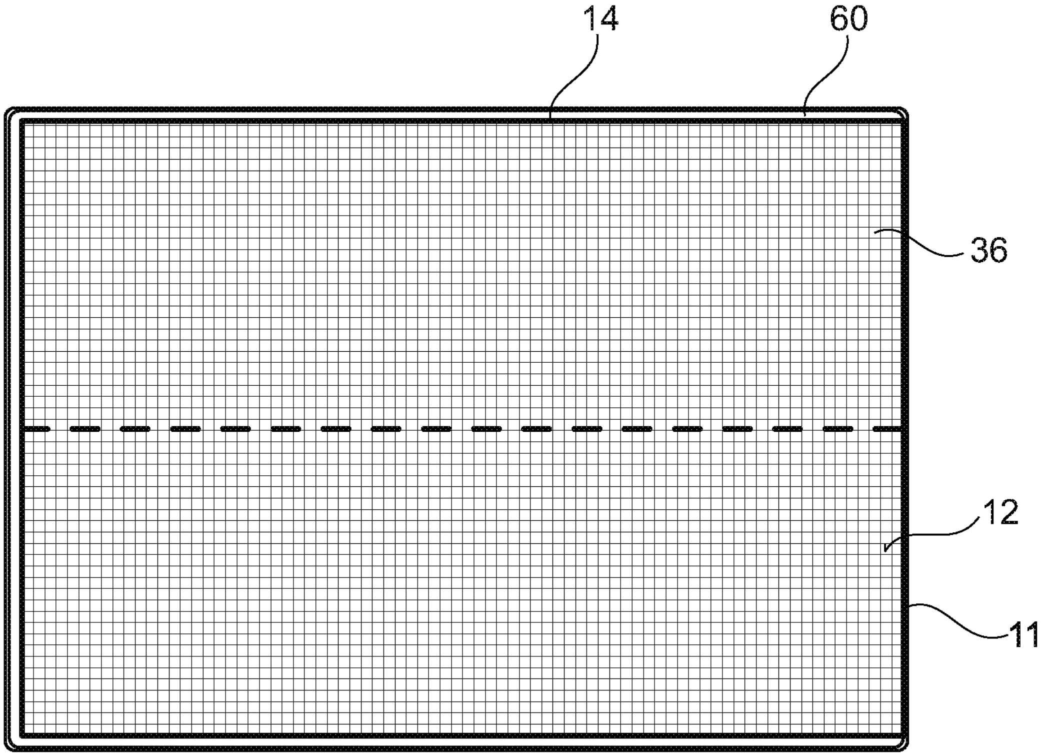

FIG. 2B illustrates a top view of the front surface 12 of the substrate 11 after the deposition of the first electrically conductive layer 36. The first electrically conductive layer 36 of the metallisation structure 20 extends over substantially the entire front surface 12 and also extends into the edge termination region 15.

Figure 2C:
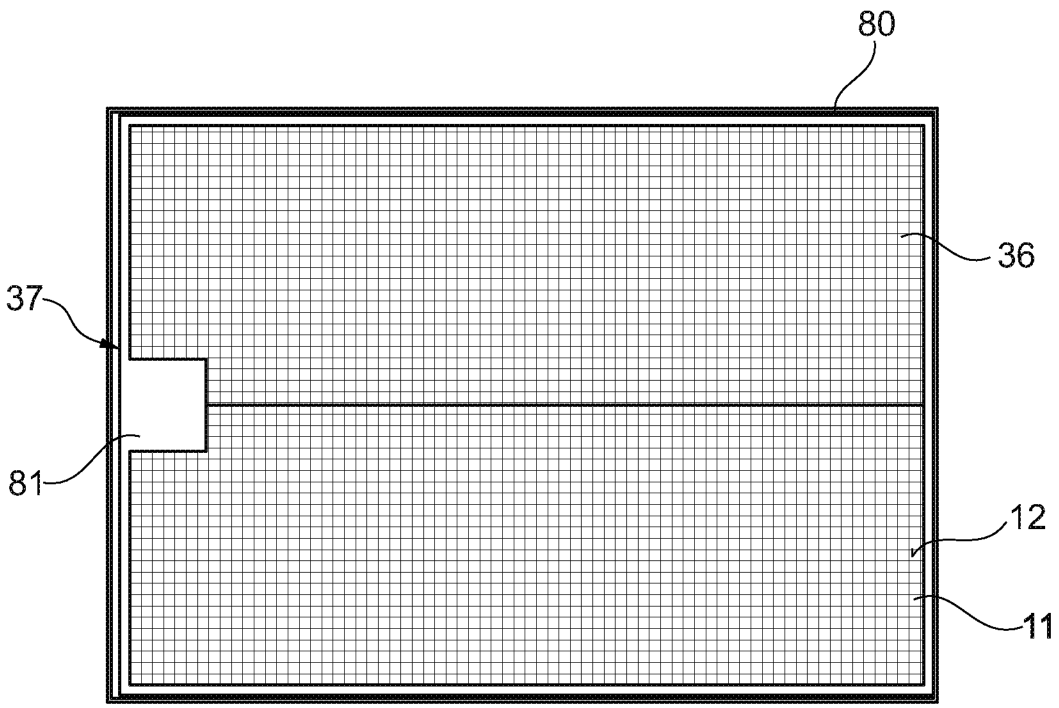

FIG. 2C illustrates a top view of the front surface 12 after the deposition of the first electrically insulating layer 37 on the first electrically conductive layer 36. The first electrically insulating layer 37 has a substantially square region 80 which is positioned towards one edge of the front surface 12 substantially in the centre of the length of the side face 52 on top of the first electrically conductive layer 36. The gate pad is to be formed on this square region 80 of the first electrically insulating layer 37. The first electrically insulating layer 37 also has a frame portion 81 which is concentric with the side faces positioned towards the peripheral edge of the front surface 12 and marks the lateral extent of the source pad to be formed on the front surface 12. The remainder of the first electrically conductive layer 36 is uncovered by the first electrically insulating layer 37.

Figure 2D:
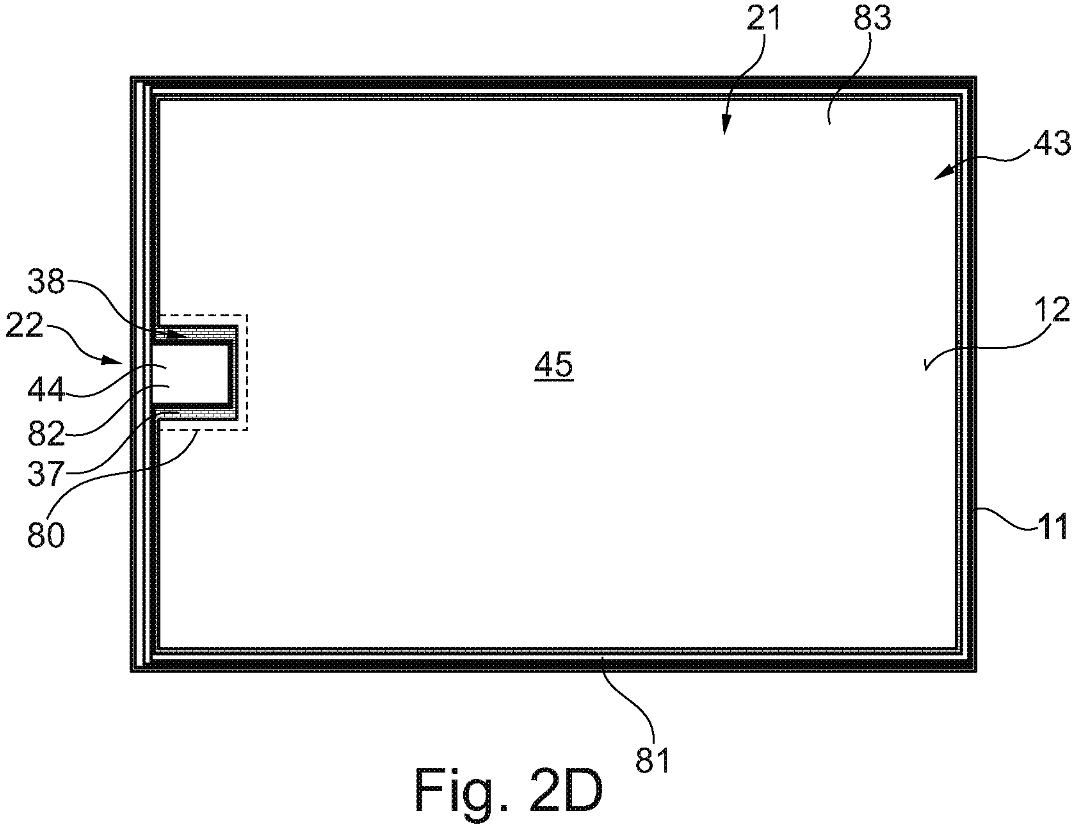

FIG. 2D illustrates a top view of the front surface 12 after formation of the first electrically conductive sublayer 43. The first electrically conductive layer 43 is structured so as to have a first section 82 that is positioned on the square portion 80 of the first electrically insulating layer 37 and that forms the first sublayer 44 of the gate pad 21. The first electrically conductive layer 43 is structured so as to provide a second section 83 that is spaced apart from the first section 82 and that forms the first sublayer 45 of the source pad 22. The first sublayer 45 extends over the first conductive layer 36 which is exposed from the first electrically insulating layer 37 and also over the peripheral regions of the first electrically insulating layer 37 which laterally surround the gate pad 21 on three sides. The first sublayer 44 of the gate pad 21 is spaced apart from the first sublayer 45 of the source pad 22 by an intervening exposed region of the first insulating layer 37 that is positioned in the gap 38 between the first sublayer 44 of the gate pad 21 and the first sublayer 45 of the source pad 22.

Figure 2E:
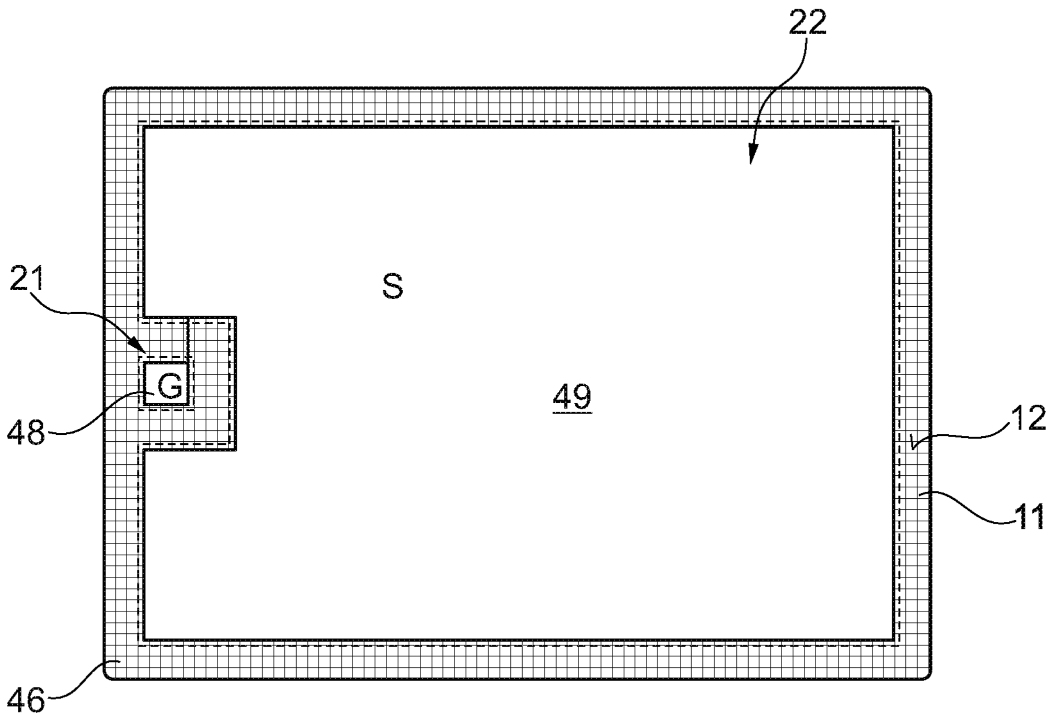

FIG. 2E illustrates a top view of the front surface 12 after the deposition of the second insulating layer 46 and second electrically conductive sublayer 47. The second electrically insulating layer 46 extends over the peripheral regions of the source pad 22 and the gate pad 21 and in the gap 38 between the gate pad 21 and source pad 22 is positioned on the first electrically insulating layer 37. The second electrically insulating layer 46 is also structured to provide a frame section at the periphery of the front surface 12. The second electrically conductive sublayer 48 is structured so as to provide the second electrically conductive sublayer 48 of the gate pad 21 and has a lateral size which typically laterally slightly smaller than the first electrically conductive sublayer 44 of the gate pad 21. The second conductive sublayer 48 also overlaps the peripheral region of the second insulating layer 46 that is positioned in the gap 38.

Similarly, the second electrically conductive sublayer 49 of the source pad 22 is positioned on the exposed portion of the first conductive sublayer 45 of the source pad 22 and also extends over the periphery of the second insulating layer 46. The second conductive sublayer 49 of the source pad 22 is laterally spaced apart from the second conductive sublayer 48 of the gate pad 21 by the intervening region of the second insulating layer 46 and by a distance which is greater than the distance between the first electrically conductive sublayer 43 of the gate pad 21 and the first electrically conductive sublayer 45 of the source pad 22.

FIGS. 1A-1H and 2A-2E illustrate a transistor device in which at least part of the gate pad 21 is arranged above the active area 14 which comprises a plurality of active transistor cells 15, each including a columnar trench 16 comprising a columnar field plate 17. However, the arrangement of the gate pad 21 above the active area 14 including the arrangement of the first electrically conductive layer 36, first electrically insulating layer 37 and the metallisation structure 20 may be used in transistor devices with other active transistor cell structures.

FIGS. 3A-3C and 4A-4D illustrate embodiments of a vertical transistor device 100 which includes a semiconductor substrate 11 with the front surface 12 and an active area 14 with a plurality of active transistor cells 15, each including a field plate 17, a mesa 18 and a gate electrode 19. The active area 14 comprises a plurality of trenches 101, which extend into the front surface 12 of the semiconductor substrate 11. Each of these trenches 101 includes a field plate 17 arranged in a lower portion of the trench 101 and a gate electrode 19 that is positioned above the field plate 17 and electrically insulated from the field plate 17. In this embodiment, each of these trenches 101 has an elongate stripe-like structure with the long direction of the trench 101 extending into the plane of the drawing. Consequently, the field plate 17 and gate electrode 19 arranged in each trench 101 also have an elongate stripe-like structure with the long direction extending into the plane of the drawing. The trenches 101 with the field plate 17 and gate electrode 19 extend substantially parallel to one another. The mesa 18 is formed between side walls of neighbouring ones of the trenches 101 and also has an elongate stripe-like structure with its long direction extending into the plane of the drawing.

The semiconductor substrate 11 comprises a highly doped drain region 23 at the rear surface 13 of the semiconductor substrate, a drift region 24 which is lightly doped with the first conductivity type on the drain region 23, a body region of the second conductivity type arranged on the drift region 24 and a source region 26 that is high doped with the first conductivity type arranged in the body region 25. Similar to the embodiment illustrated in FIGS. 1A-1H and 2A-2E, a metallization structure 20 is provided on the front surface 12 which comprises a gate pad 21 and a source pad 22 and at least part of the gate pad 21 is arranged above the active area 14. In some embodiments, two source pads 22 are provided.

Similar to the embodiments illustrated with reference to FIGS. 1A-1H and 2A-2E, the first electrically conductive layer 36 is arranged on the first surface 12 and has a lateral extent such that it is positioned under a least a part of the gate pad 21 and under the source pad 22. A second contact 35 to each mesa 18 is provided that extends through the third electrically insulating layer 50 positioned between the mesas 18 and the first electrically conductive layer to form an electrical connection between the source region 26 and the body region 25 of the mesa 18 and the first electrically conductive layer 36. The first electrically conductive layer 36 is electrically connected to the source pad 22.

Similar to the embodiments illustrated with reference of FIGS. 1A-1H and 2A-2E, the first electrically insulating layer 37 is arranged on the first electrically conductive layer 36 and has a lateral extent such that it is positioned between the gate pad 21 and the first electrically conductive layer 36 so as to electrically insulate the overlying gate pad 21 from the underlying first electrically conductive layer 36 and such that it extends under a peripheral region 39 of the source pad 22. The remaining portion 40 of the source pad 22 is in direct contact with the first electrically conductive layer 36 to enable the source pad 22 to be electrically connected to the mesas 18.

Similar to the embodiment illustrated in FIGS. 1A-1H and 2A-2E, the second insulating layer 46 is arranged on the front surface 21 such that it is positioned on the first insulating layer 37 in the gap 38 positioned laterally between the gate pad 21 and the source pad 22 and such that it overlaps the peripheral regions of the gate pad 21 and the source pad 22. In some embodiments, the gate pad 21 and the source pad 22 each comprise two electrically conductive sublayers. The second insulating layer 46 is arranged on the peripheral regions of the lower first electrically conductive sublayer 44 of the gate pad 21 and of the lower first electrically conductive sublayer 45 of the source pad 22. The second electrically conductive sublayer 48 of the gate pad 21 is arranged on the peripheral regions of the second insulating layer 46 and is in direct contact with the first electrically conductive sublayer 44 of the gate pad 21 in regions of the first conductive sublayer 44 of the gate pad 21 that are uncovered by the second insulating layer 46. The second conductive sublayer 49 of the source pad 22 has similar arrangement such that it is arranged on the peripheral region of the second insulating layer 46 above the first electrically conductive sublayer 45 of the source pad 22 and such that in the remaining region of the first electrically conductive sublayer 45, which is uncovered by the second insulating layer 46, it is in direct contact with the first electrically conductive sublayer 45.

Figure 3A:
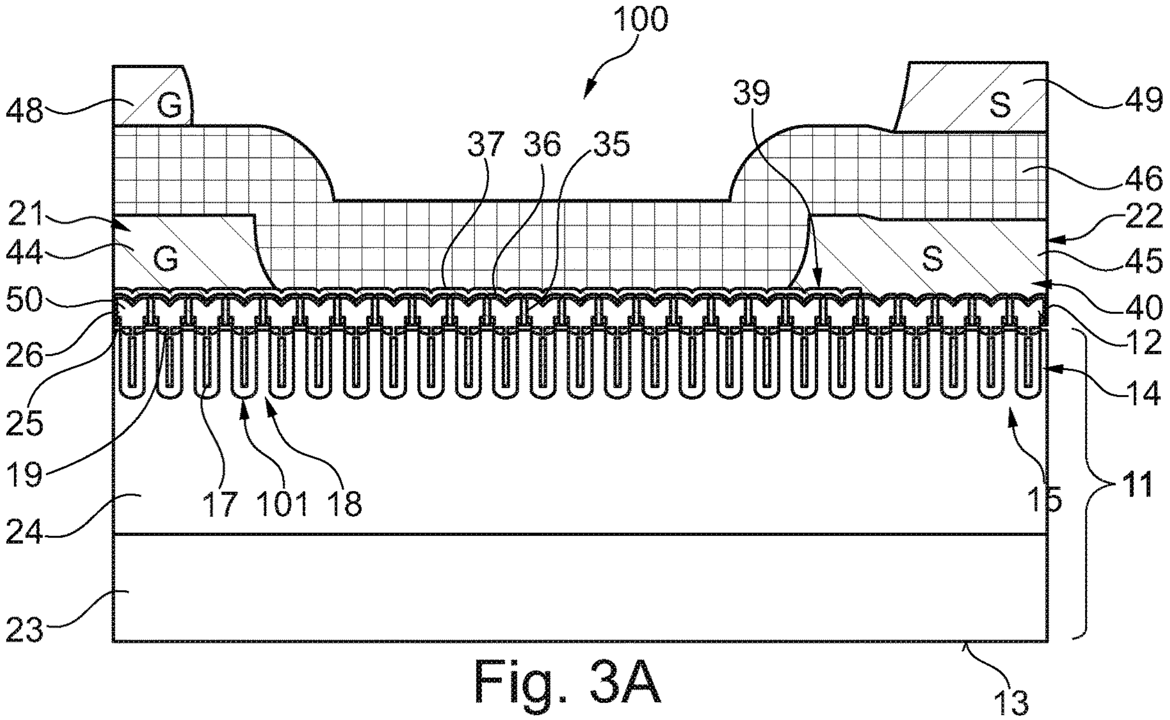
FIG. 3A illustrates a cross-sectional view of a transistor device according to an embodiment.
Figure 3B:
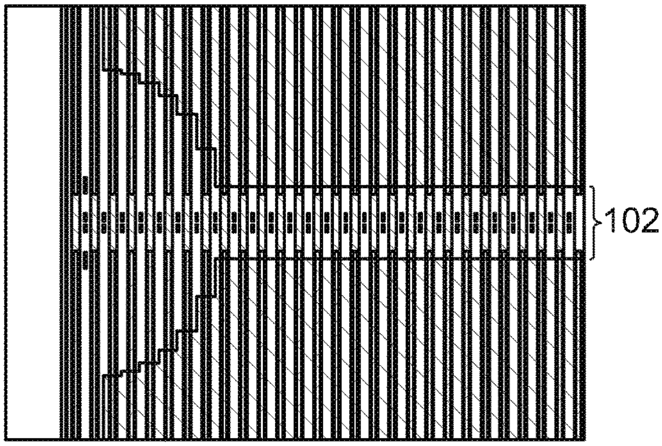
FIGS. 3B and 3C illustrate plan views of a portion of the transistor device of FIG. 3A.
Figure 3C:
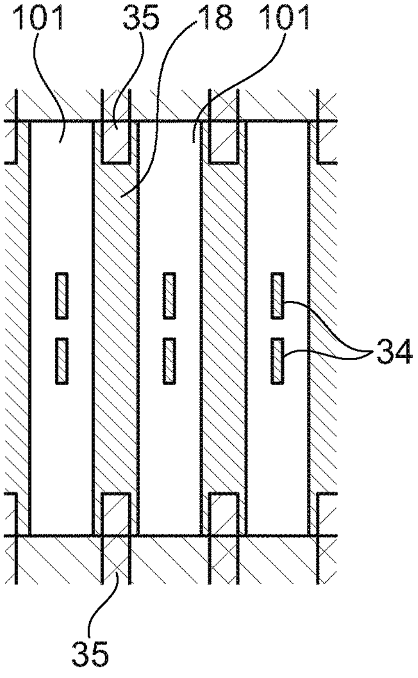

FIGS. 3B and 3C illustrate enlarged top views of portions of the transistor device 100 of FIG. 3A. FIGS. 3B and 3C illustrate the elongate strip-like trench trenches 101 and the elongate strip like mesas 18 formed between the sidewalls of neighbouring trenches 101. The second contact 35 to the mesa 18 may be elongate and extend along the entire length of the mesa 18. In some embodiments, a source finger 102 is formed which extends substantially perpendicularly to the long direction of the trenches 101 and in which the first contact 34 to the field plate 17 arranged in the trenches 101 is formed. One or more first contacts 35 to each field plate 17 may be provided. The first contact 34 to the field plate 17 in the trench 101 as well as the second contact 35 to the mesa 18 are electrically connected to the overlying first conductive layer 36. The source region 2*b* may be omitted from this region laterally arranged between the two elongate contacts 35.

Figure 4A:
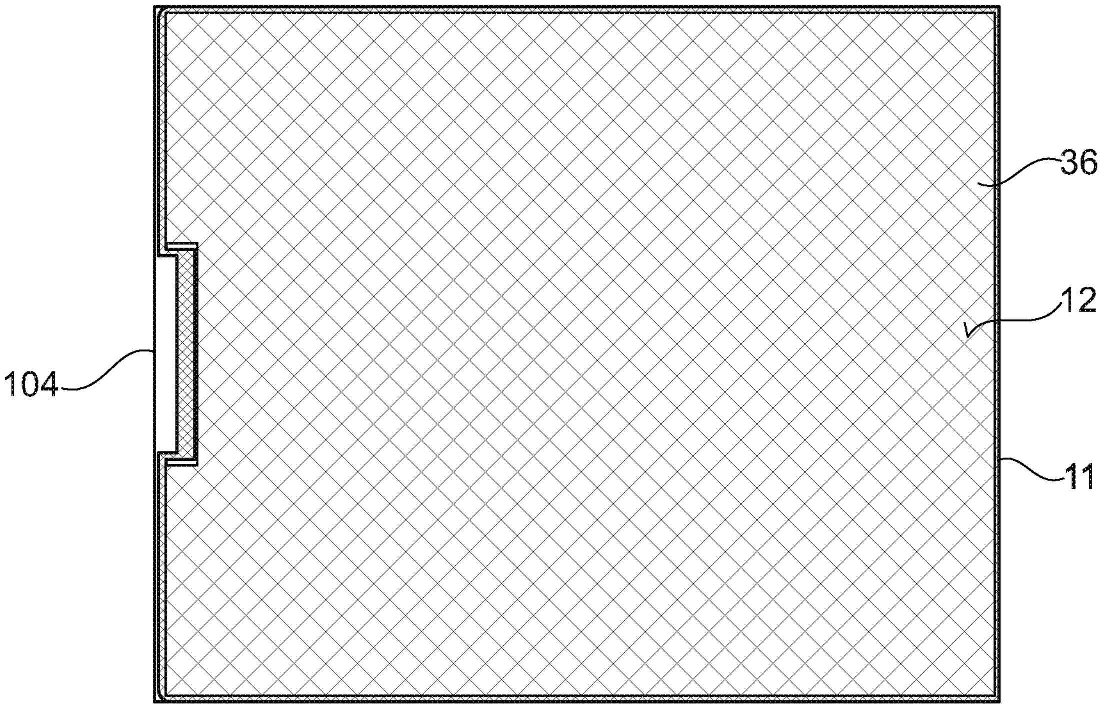
FIGS. 4A to 4D illustrate top views of various layers of a metallisation structure of the transistor device of FIGS. 3A to 3C.

FIGS. 4A to 4D illustrate a top view of the front surface 12 of the transistor device 100 and various layers of the metallisation structure 20 of the transistor device 100. FIG. 4A illustrates a top view of the first conductive layer 36 which extends over substantially the entire front surface 12 of the semiconductor substrate 11. In some embodiments, an indentation which remains uncovered by the first conductive layer 36 is provided adjacent a side edge 104 of the semiconductor substrate 11 above which a portion of above which at least a part of the gate pad will be positioned.

Figure 4B:
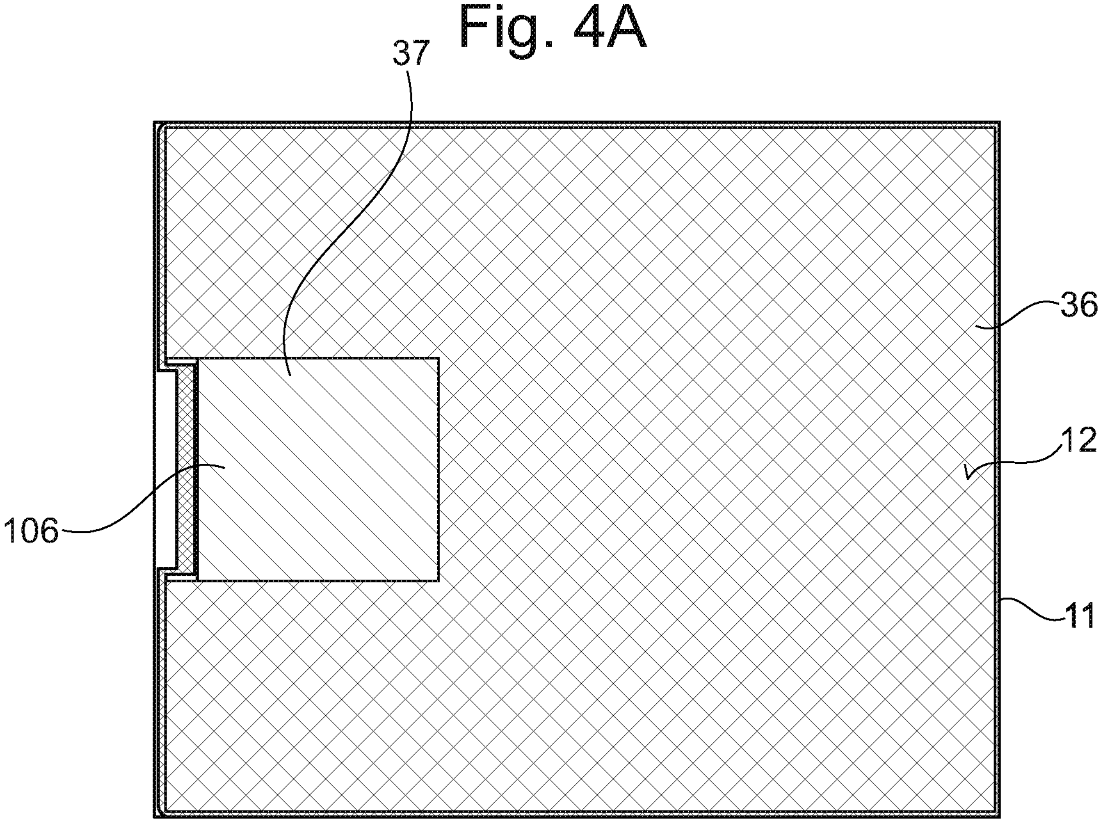

FIG. 4B illustrates the front surface 12 after the deposition of the first electrically insulating layer 37. The first insulating layer 37 includes a square section which is positioned above a portion of the first electrically conductive layer 36 and which is to electrically insulate an overlying gate pad 21 from the underlying first conductive layer 36. The gate pad 21 may be positioned in a corner of the front surface 12 or, as in the embodiment illustrated in FIGS. 4A to 4D, be positioned intermediate the length of the side face 104, approximately and the centre of the side face 104.

Figure 4C:
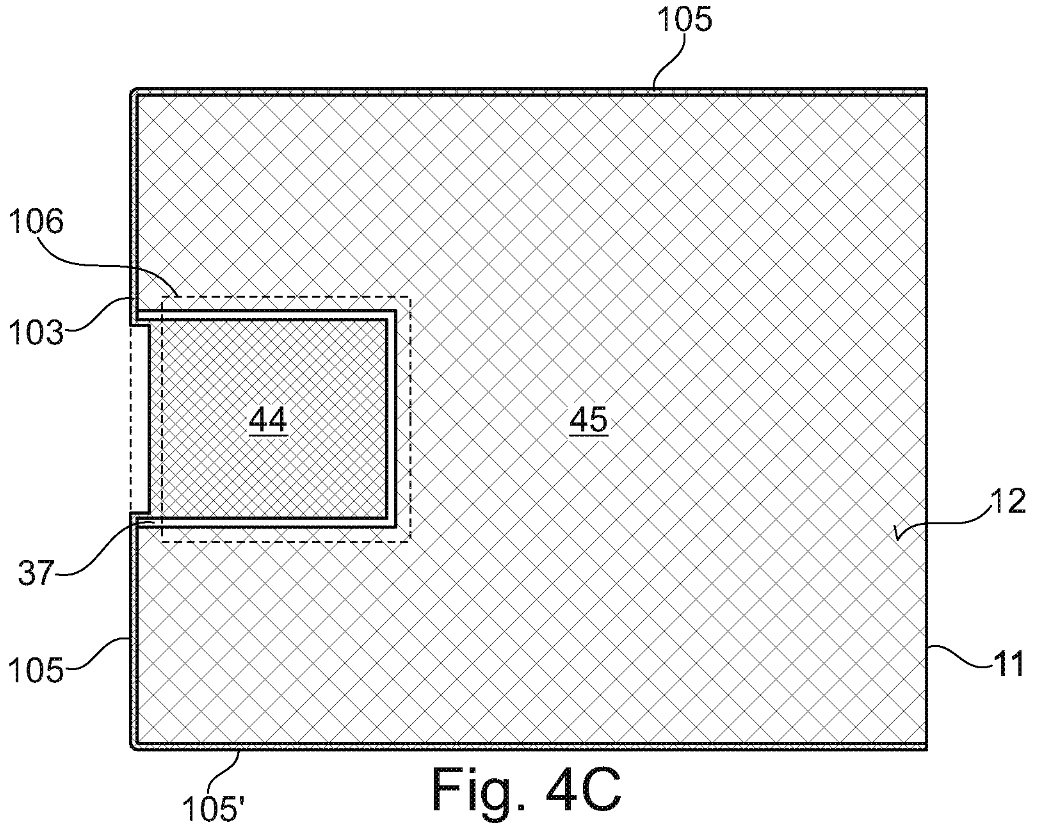

FIG. 4C illustrates the front surface 12 after the deposition and structuring of the first electrically conductive sublayer 43 and illustrates the lateral arrangement of the first conductive sublayer 44 of the gate pad 21 and the first electrically conductive sublayer 45 of the source pad 22. The first electrically conductive sublayer 44 of the gate pad 22 is positioned directly on and above the insulating layer 37 and has a lateral area which is smaller than the lateral area of the square section of the first insulating layer 37. The first electrically conductive sublayer 45 of the source pad 22 has a U-shape and extends over nearly all of the remainder of the front surface 12. The first electrically conductive sublayer 45 of the source pad 22 is spaced apart from the first electrically conductive sublayer 44 of the gate pad 21 such that a region of the first insulating layer 37 is positioned in the gap 38 laterally between the two portions of the first electrically conductive sublayer 44, 45. The peripheral region of the first electrically conductive sublayer 45 of the source pad, which is arranged laterally adjacent the gate pad 21, may overlap and be positioned on the peripheral region of the first electrically conductive insulating layer 37. The first electrically conductive sublayer 43 may also be patterned to form a gate runner 103 which extends from the first electrically conductive sublayer 44 of the gate pad 21. In this embodiment, the gate runner 103 extends from the gate pad 21 along the first side face 104 and along the two opposing perpendicular side faces 105, 105'. The gate runner 103 is laterally spaced apart from the source pad 22.

Figure 4D:
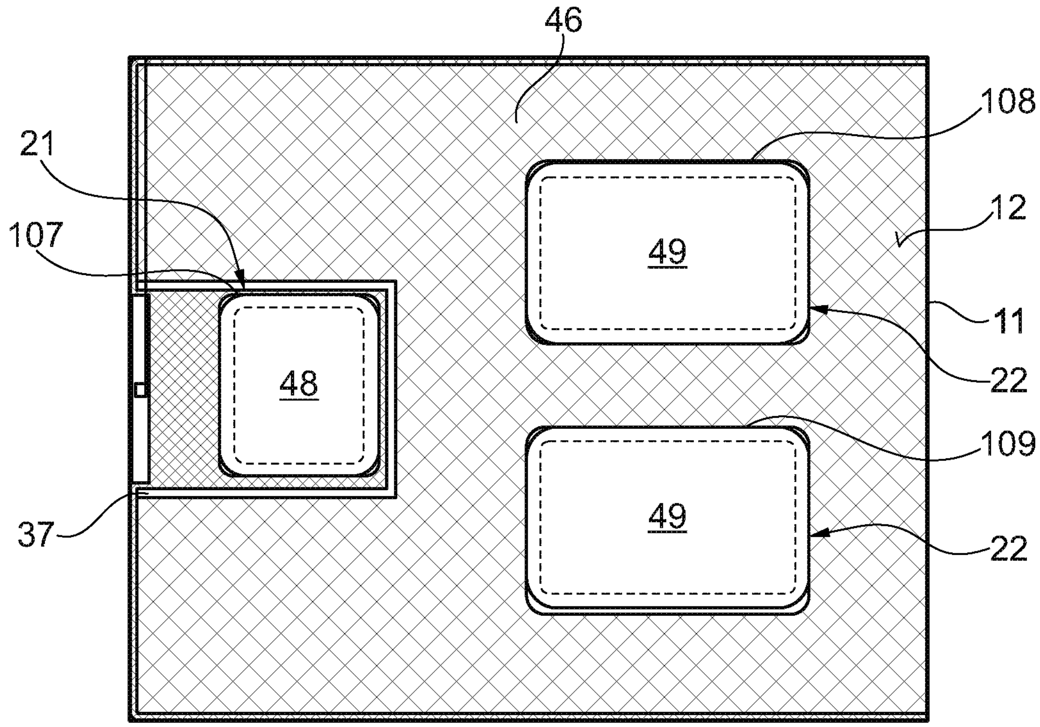

FIG. 4D illustrates the arrangement of the second electrically insulating layer 46 which, in this embodiment, extends over the entire front surface 12 of the semiconductor substrate 11. The second insulating layer 46 has an opening 107 which is positioned above and exposes a portion of the first electrically conductive sublayer 44 of the gate pad 21 and two openings 108, 109 which are positioned above and expose portions of the first electrically conductive sublayer 45 of the source pad 22. The second electrically conductive sublayer 48 is arranged within the opening 107 to form a gate pad 21. In some embodiments, the lateral extent of the second electrically conductive sublayer 48 is slightly greater than the lateral extent the opening 107 such that the second electrically conductive layer 44 of gate pad 21 overlaps the peripheral regions of the second insulating layer 46 defining the opening 107.

The second electrically conductive sublayer 49 is arranged within the each of the openings 108, 109 to form two discrete source pads 22. In some embodiments, the lateral extent of the second electrically conductive sublayer 49 is slightly greater than the lateral extent of each of the openings 108, 109 such that the second electrically conductive layer 49 of source pad 22 overlaps the peripheral regions of the second insulating layer 46 defining the opening 108, 109. The source pads 22 are laterally spaced apart from the gate pad 21.

The following examples are also provided.

Examples

1. A transistor device, comprising: a semiconductor substrate comprising a front surface and an active area, wherein the active area comprises a plurality of active transistor cells, each active transistor cell comprising a columnar trench comprising a field plate, a mesa, and a gate electrode; a metallization structure arranged on the front surface, the metallization structure providing a gate pad and a source pad, wherein at least a part of the gate pad is arranged above the active area.

2. A transistor device according to example 1, further comprising a first contact to each of the field plates, a second contact to each of the mesas and a first electrically conductive layer arranged on the first surface, wherein the first and second contacts are electrically connected by the first electrically conductive layer and the first electrically conductive layer is positioned under the gate pad and under the source pad.

3. A transistor device according to example 2, further comprising a first electrically insulating layer arranged under the gate pad and between the gate pad and the first electrically conductive layer, the first electrically insulating layer electrically insulating the gate pad from the first electrically conductive layer.

4. A transistor device according to example 3, wherein the first electrically insulating layer further extends under a peripheral region of the source pad.

5. A transistor device according to example 3 or example 4, wherein the first electrically insulating layer comprises a first sublayer arranged on the first electrically conductive layer and a second sublayer arranged on the first sublayer.

6. A transistor device according to example 5, wherein the first sublayer comprises silicon nitride and the second sublayer comprises silicon oxide.

7. A transistor device according to any one of examples 2 to 6, further comprising a second electrically insulating layer arranged on the first electrically insulating layer, wherein the second electrically insulating layer is arranged laterally between the gate pad and the source pad and extends over peripheral portions of the gate pad and the source pad.

8. A transistor device according to example 7, wherein the gate pad comprises a first conductive sublayer arranged on the first electrically insulating layer and a second conductive sublayer arranged on the first conductive sublayer and wherein the second electrically insulating layer extends over peripheral portions of the first sublayer of the gate pad and the second sublayer of the gate pad extends over peripheral regions of the second electrically insulating layer.

9. A transistor device according to example 7 or example 8, wherein the source pad comprises a first conductive sublayer arranged on the first electrically conductive layer and a second conductive sublayer arranged on the first conductive sublayer and wherein the second electrically insulating layer extends over peripheral portions of the first sublayer of the source pad and the second sublayer of the source pad extends over peripheral regions of the second electrically insulating layer.

10. A transistor device according to example 8 or example 9, wherein the first conductive layer comprises tungsten, the first conductive sublayer is formed of AlCu alloy and the second conductive sublayer comprises copper.

11. A transistor device according to one of examples 1 to 10, further comprising a gate connection structure on the first surface that electrically couples the gate electrodes to the gate pad.

12. A transistor device according to one of examples 2 to 10, wherein the transistor device further comprises a third electrically insulating layer arranged between the front surface of the semiconductor substrate and the first electrically conductive layer and the first and second contacts extend from the first electrically conductive layer through the third electrically insulating layer.

13. A transistor device according to one of examples 1 to 12, wherein the gate electrode is arranged in gate trench that extends from the front surface of the semiconductor substrate into the mesa, wherein the gate trench has an elongate strip form, a grid form of a hexagonal form.

14. A transistor device according to example 13, wherein each mesa of the active transistor cells comprises a drain region of a first conductivity type, a drift region of a first conductivity type arranged on the drain region, a body region of the second conductivity type arranged on the drift region, the second conductivity type opposing the first conductivity type and a source region of the first conductivity type arranged on the body region, wherein the gate trench extends through the source region and the body region into the drift region, wherein each of the columnar trenches extends from the front surface through the body region and into the drift region.

15. A transistor device according to any one of examples 1 to 14, further comprising an edge termination region that laterally surrounding the active area, wherein the edge termination region comprises: a transition region laterally surrounding the active region and an outer termination region laterally surrounding the transition region, a plurality of inactive cells arranged in the transition region and in the outer termination region, each inactive cell comprising a columnar termination trench comprising a field plate and a termination mesa comprising a drift region of a first conductivity type, wherein, in the transition region, the termination mesa comprises a body region of the second conductivity type arranged on the drift region and in the outer termination region the drift region of the termination mesa extends to the first surface; a buried doped region of the second conductivity type that has a lateral extent such that it is positioned in the transition region and in the outer termination region.

16. A semiconductor device according to example 15, wherein the buried doped region comprises an inner edge that is positioned under the body region in the transition region and an outer edge that is positioned outside of the plurality of inactive cells in the outer termination region.

17. A semiconductor device according to example 15 or example 16, wherein, in the transition region, the buried doped region is vertically spaced apart from the body region of the termination mesa by a portion of the drift region.

18. A semiconductor device according to any one of examples 15 to 17, wherein in the transition region the body region of the termination mesas extends to the first surface.

19. A transistor device, comprising: a semiconductor substrate comprising a front surface and an active area, wherein the active area comprises a plurality of elongate trenches extending into the front surface, each comprising a field plate and a gate electrode that is arranged above and electrically insulated from the field plate and a plurality of an elongate mesas, each elongate mesa being formed between neighbouring one of the elongate trenches; a metallization structure arranged on the front surface, the metallization structure providing a gate pad and a source pad, wherein at least a part of the gate pad is arranged above the active area.

20. A transistor device according to example 19, further comprising a first contact to each of the field plates, a second contact to each of the mesas and a first electrically conductive layer arranged on the first surface, wherein the first and second contacts are electrically connected by the first electrically conductive layer and the first electrically conductive layer is positioned under the gate pad and under the source pad.

21. A transistor device according to example 20, further comprising a first electrically insulating layer arranged under the gate pad and between the gate pad and the first electrically conductive layer, the first electrically insulating layer electrically insulating the gate pad from the first electrically conductive layer.

22. A transistor device according to example 21, wherein the first electrically insulating layer further extends under a peripheral region of the source pad.

23. A transistor device according to example 21 or example 22, wherein the first electrically insulating layer comprises a first sublayer arranged on the first conductive layer and a second sublayer arranged on the first sublayer.

24. A transistor device according to example 23, wherein the first sublayer comprises silicon nitride and the second sublayer comprises silicon oxide.

25. A transistor device according to any one of examples 10 to 24, further comprising a second electrically insulating layer arranged on the first electrically insulating layer, wherein the second electrically insulating layer is arranged laterally between the gate pad and the source pad and extends over peripheral portions of the gate pad and the source pad.

26. A transistor device according to example 25, wherein the gate pad comprises a first conductive sublayer arranged on the first electrically insulating layer and a second conductive sublayer arranged on the first conductive sublayer and wherein the second electrically insulating layer extends over peripheral portions of the first sublayer of the gate pad and the second sublayer of the gate pad extends over the peripheral regions of the second electrically insulating layer.

27. A transistor device according to example 25 or example 26, wherein the source pad comprises a first conductive sublayer arranged on the first electrically conductive layer and a second conductive sublayer arranged on the first conductive sublayer and wherein the second electrically insulating layer extends over peripheral portions of the first sublayer of the source pad and the second sublayer of the source pad extends over the peripheral regions of the second electrically insulating layer.

28. A transistor device according to example 26 or example 27, wherein the first conductive layer comprises tungsten, the first conductive sublayer is formed of AlCu alloy and the second conductive sublayer comprises copper.

29. A transistor device according to one of examples 19 to 28, further comprising a gate connection structure on the first surface that electrically couples the gate electrodes to the gate pad.

30. A transistor device according to one of examples 20 to 19, wherein the transistor device further comprises a third electrically insulating layer arranged between the front surface of the semiconductor substrate and the first electrically conductive layer and the first and second contacts extend from the first electrically conductive layer through the third electrically insulating layer.

31. A transistor device according to one of examples 19 to 30, wherein each elongate mesa comprises a drain region of a first conductivity type, a drift region of a first conductivity type arranged on the drain region, a body region of the second conductivity type arranged on the drift region, the second conductivity type opposing the first conductivity type, and a source region of the first conductivity type arranged on the body region.

32. A transistor device according to example 31, wherein the first contacts to the field plate are arranged intermediate the length of the elongate trenches.

33. A transistor device according to example 32, wherein each elongate mesa comprises two elongate second contacts that are spaced apart by a gap and the first contacts to the field plates in the trenches are arranged in the gap.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor device, comprising:

a semiconductor substrate comprising a front surface and an active area, wherein the active area comprises a plurality of active transistor cells, each active transistor cell comprising a columnar trench comprising a field plate, a mesa, and a gate electrode; and a metallization structure arranged on the front surface, the metallization structure providing a gate pad and a source pad, wherein at least a part of the gate pad is arranged above the active area.

2. The transistor device of claim 1, further comprising a first contact to each of the field plates, a second contact to each of the mesas, and a first electrically conductive layer arranged on the first surface, wherein the first and second contacts are electrically connected by the first electrically conductive layer, and wherein the first electrically conductive layer is positioned under the gate pad and under the source pad.

3. The transistor device of claim 2, further comprising a first electrically insulating layer arranged under the gate pad and between the gate pad and the first electrically conductive layer, the first electrically insulating layer electrically insulating the gate pad from the first electrically conductive layer.

4. The transistor device of claim 3, wherein the first electrically insulating layer further extends under a peripheral region of the source pad.

5. The transistor device of claim 3, wherein the first electrically insulating layer comprises a first sublayer arranged on the first electrically conductive layer and a second sublayer arranged on the first sublayer.

6. The transistor device of claim 5, wherein the first sublayer comprises silicon nitride and the second sublayer comprises silicon oxide.

7. The transistor device of claim 3, further comprising a second electrically insulating layer arranged on the first electrically insulating layer, wherein the second electrically insulating layer is arranged laterally between the gate pad and the source pad and extends over peripheral portions of the gate pad and the source pad.

8. The transistor device of claim 7, wherein the gate pad comprises a first electrically conductive sublayer arranged on the first electrically insulating layer and a second electrically conductive sublayer arranged on the first electrically conductive sublayer, and wherein the second electrically insulating layer extends over peripheral portions of the first electrically conductive sublayer of the gate pad and the second electrically conductive sublayer of the gate pad extends over peripheral regions of the second electrically insulating layer.

9. The transistor device of claim 8, wherein the first electrically conductive layer comprises tungsten, wherein the first electrically conductive sublayer is formed of AlCu alloy, and wherein the second electrically conductive sublayer comprises copper.

10. The transistor device of claim 7, wherein the source pad comprises a first electrically conductive sublayer arranged on the first electrically conductive layer and a second electrically conductive sublayer arranged on the first conductive sublayer, and wherein the second electrically insulating layer extends over peripheral portions of the first electrically conductive sublayer of the source pad and the second electrically conductive sublayer of the source pad extends over peripheral regions of the second electrically insulating layer.

11. The transistor device of claim 10, wherein the first electrically conductive layer comprises tungsten, wherein the first electrically conductive sublayer is formed of AlCu alloy, and wherein the second electrically conductive sublayer comprises copper.

12. The transistor device of claim 2, further comprising a third electrically insulating layer arranged between the front surface of the semiconductor substrate and the first electrically conductive layer, wherein the first and second contacts extend from the first electrically conductive layer through the third electrically insulating layer.

13. The transistor device of claim 1, further comprising a gate connection structure on the first surface and that electrically couples the gate electrodes to the gate pad.

14. The transistor device of claim 1, wherein for each active transistor cell, the gate electrode is arranged in a trench that extends from the front surface of the semiconductor substrate into the mesa and the trench has a strip form or a grid form or a hexagonal form.

15. The transistor device of claim 14, wherein each mesa of the active transistor cells comprises a drain region of a first conductivity type, a drift region of the first conductivity type arranged on the drain region, a body region of a second conductivity type arranged on the drift region, the second conductivity type opposing the first conductivity type, and a source region of the first conductivity type arranged on the body region, wherein for each active transistor cell, the trench with the gate electrode extends through the source region and the body region into the drift region, and wherein each of the columnar trenches extends from the front surface through the body region and into the drift region.

16. The transistor device of claim 1, wherein for each active transistor cell, the gate electrode is a planar gate arranged on the mesa.

17. The transistor device of claim 1, further comprising an edge termination region that laterally surrounds the active area, wherein the edge termination region comprises:

a transition region laterally surrounding the active region and an outer termination region laterally surrounding the transition region;

a plurality of inactive cells arranged in the transition region and in the outer termination region, each inactive cell comprising a columnar termination trench comprising a field plate and a termination mesa comprising a drift region of a first conductivity type, wherein in the transition region, each termination mesa comprises a body region of a second conductivity type arranged on the drift region and in the outer termination region the drift region of the termination mesa extends to the front surface; and a buried doped region of the second conductivity type that has a lateral extent such that the buried doped region is positioned in the transition region and in the outer termination region.

* * * * *